United States Patent [19]
Miner et al.

[11] Patent Number: 6,114,258
[45] Date of Patent: Sep. 5, 2000

[54] METHOD OF OXIDIZING A SUBSTRATE IN THE PRESENCE OF NITRIDE AND OXYNITRIDE FILMS

[75] Inventors: Gary E. Miner, Newark; Guangcai Xing, Fremont; David R. Lopes, Sunnyvale; Sathees Kuppurao, Santa Clara, all of Calif.

[73] Assignee: Applied Materials, Inc., Santa Clara, Calif.

[21] Appl. No.: 09/175,144

[22] Filed: Oct. 19, 1998

[51] Int. Cl.[7] .................... H01L 21/8238; H01L 21/336; H01L 21/3205; H01L 21/31; H01L 21/469

[52] U.S. Cl. .................. 438/787; 438/216; 438/287; 438/591; 438/761; 438/762; 438/770; 438/774

[58] Field of Search ................... 438/773, 787, 438/770, 769, 216, 287, 591, 954, 761, 762, 765, 778

[56] References Cited

U.S. PATENT DOCUMENTS

| | | | |
|---|---|---|---|
| 4,139,658 | 2/1979 | Cohen et al. | 427/93 |
| 5,155,336 | 10/1992 | Gronet et al. | 219/411 |
| 5,210,056 | 5/1993 | Pong et al. | 437/239 |
| 5,294,571 | 3/1994 | Fujishiro et al. | 437/239 |
| 5,447,884 | 9/1995 | Fahey et al. | 437/67 |
| 5,541,141 | 7/1996 | Cho | 437/239 |
| 5,631,199 | 5/1997 | Park | 438/770 |
| 5,731,247 | 3/1998 | Ueno et al. | 438/773 |
| 5,763,315 | 6/1998 | Benedict et al. | 438/424 |
| 5,777,300 | 7/1998 | Homma et al. | 219/679 |
| 5,851,892 | 12/1998 | Lojek et al. | 438/305 |
| 5,861,347 | 1/1999 | Maiti et al. | 438/787 |

FOREIGN PATENT DOCUMENTS

| | | |
|---|---|---|
| 0 617 461 A | 9/1994 | European Pat. Off. . |
| 0 884 401 A | 12/1998 | European Pat. Off. . |

OTHER PUBLICATIONS

Enomoto et al. "Thermal Oxidation Rate of Si3N4 Film and Its Masking Effect against Oxidation of Silicon," Japanese Journal of Applied Physics, vol. 17, No. 6 (1978) p. 1049–1058, Jun. 1978.

Deal. "Thermal Oxidation Kinetics of Silicon in Pyrogenic H2O and 5% HCI/H2O Mixtures," Journal of Electrochemical Society: Solid–State Science and Technology, vol. 125, No. 4 (1978) p. 576–679, Apr. 1978.

Chandorkar et al. "Dependence of Partial Pressure of H2O on Pyrogenic Growth of Silicon Dioxide," Journal of Electrochemical Society: Solid–State Science and Technology, vol. 132, No. 2 (1985) p. 415–417, Feb. 1985.

Iwata et al., "A New Tungsten Gate Process for VLSI Applications," 1983 IEEE, pp. 1174–1179.

J.A. Aboaf, "*Formation of 20–35Å Thermal Oxide Films on Silicon at 950°C–1140°C*," Journal of the Electrochemical Society, vol. 118, No. 8, Aug. 1971, pp. 1370–1371.

Tseng Y–C et al., "*A New Method for Obtaining a Clean $SiO_2$–Si Interface Using $NH_3$–$O_2$ Oxidation*," Japanese Journal of Applied Physics, vol. 28, No. 2, Feb. 1989, pp. L329–331.

"Patent Abstracts of Japan," vol. 016, No. 488, Oct. 9, 1992, Pub. Date Jun. 25, 1992.

Chandorkar, et al., "Dependence of Partial Pressure of H2O on Pyrogenic Growth of Silicon Dioxide," Journal of the Electrochemical Society, Manchester, NH, vol. 132, Feb. 1985, pp. 415–417.

Lin, et al., "Selective Oxidation of Si in the Presence of W and WN," Rapid Thermal and Integrated Processing VII. Symposium, San Francisco, CA, 13–15 Apr. 1998m oo, 359–364.

*Primary Examiner*—Charles Bowers
*Assistant Examiner*—Thanhha Pham
*Attorney, Agent, or Firm*—Blakely Sokoloff Taylor & Zafman

[57] ABSTRACT

A system and method of forming an oxide in the presence of a nitrogen-containing material. A substrate having a nitrogen-containing material on a surface is placed in a reaction chamber. An oxygen-containing gas, or an oxygen-containing gas and a hydrogen-containing gas are provided to the chamber and reacted in the chamber. The reactive gases are used to oxidize the surface of the substrate and displace the nitrogen-containing material from the interface.

24 Claims, 16 Drawing Sheets

METHOD OF OXIDIZING A SUBSTRATE IN THE PRESENCE OF NITRIDE AND OXYNITRIDE FILMS

BACKGROUND OF THE INVENTION

1. Field of the Invention

The invention relates to the field of substrate oxidation and more specifically to a method for in situ moisture generation and a rapid thermal steam oxidation process.

2. Description of Related Art

In the fabrication of modern integrated circuits, such as microprocessors and memories, oxidation processes are used to passivate or oxidize semiconductor films. Popular methods to oxidize silicon surfaces in film such as polysilicon gate electrodes and substrates include pure oxygen ($O_2$) and a water vapor or steam ($H_2O$) oxidation process. In either case, the oxygen or water vapor is brought into an oxidation chamber to react with the silicon surfaces to form silicon dioxide ($SiO_2$).

Present steam oxidation processes generally take place in multi-wafer, resistively-heated "hot wall" furnaces. These steam oxidation processes typically use a pyrogenic torch or bubbler located outside of the reaction chamber in which the steam oxidation process is to take place. In the case of a pyrogenic torch, a hydrogen-containing gas and an oxygen-containing gas are ignited by flame in a reaction area at atmospheric pressure and located away from and generally in a different chamber than the chamber in which wafers are placed. The flame ignition occurs at atmospheric pressure. A problem associated with pyrogenic torch methods is that, for safety reasons, only certain concentration ratios of hydrogen-containing gas and oxygen-containing gas can be utilized. Limiting the available gas ratio unduly restricts the ability to generate ambients with desired concentrations of $H_2O/H_2$ or $H_2O/O_2$. For example, in order to keep a stable flame burning, torch methods typically require $H_2:O_2$ ratios of more than 0.5:1 and less than 1.8:1, respectively. Bubblers are also undesirable for moisture generation in that they can be a significant source of contamination and because they cannot accurately and reliably control the amount of moisture generated.

Another problem associated with the use of pyrogenic torches and bubblers is that these methods are not easily implemented into modern rapid thermal heating apparatus which utilize light sources for rapid temperature ramps and reaction times measured in terms of seconds as opposed to minutes and hours. Rapid thermal heaters are preferred over resistively heated furnaces because of their excellent temperature uniformity and control which provides for more uniform processing and because their short reaction times reduce the thermal budget of fabricated devices.

In many oxidation processes for ultra-high performance integrated circuit applications, a pure $SiO_2$ film is not desirable as the final structure. For example, although a $SiO_2$ film may provide adequate insulative properties, thin $SiO_2$ films have been found to be penetrable by dopants leading to undesirable results. For example, in complementary metal oxide semiconductor (CMOS) circuits, gate doping is utilized, in part, to lower the threshold voltage ($V_T$) associated with an individual transistor device. Thus, for example, a polysilicon gate will be doped with boron as part of a PMOS device or phosphorus, arsenic, or antimony for an NMOS device. As the gate oxide beneath the polysilicon gate gets smaller, for example in the range of 0.1–0.20 microns, dopants infused into the gate, particularly boron, diffuse through the gate oxide, particularly during a high temperature annealing activation step to activate the dopants in the gate and the diffusion regions. In the case of boron, the boron diffuses through the gate oxide and gets deposited in the channel beneath the transistor device adding more charge. The additional charge becomes scattering centers to charge carriers conducting the current. The scattering creates electric field changes which degrade the mobility of the device. The diffusion of the boron into the channel also unacceptably shifts the $V_T$.

To prevent dopants from diffusing through thin oxides, such as boron through a thin gate oxide, prior art processes have added to the ambient nitrogen-containing sources such as nitrous oxide ($N_2O$), nitrogen oxide (NO), and ammonia ($NH_3$), each typically having a nitrogen content of zero to five percent or more. The nitrogen-containing material forms a film or layer (typically a silicon nitride ($Si_3N_4$) or silicon oxynitride ($Si_xN_yO_z$) film or layer) that acts as a barrier layer to prevent the diffusion of dopants through the oxide.

In the case of gate oxides, prior art methods place nitrogen-containing materials films at the gate oxide-silicon interface. This has deleterious effects on device performance, by creating scattering centers and degrading channel mobility. To date, however, efforts to place an oxide ($SiO_2$) at the semiconductor surface and retain the nitrogen-containing material have proved costly in terms of the time involved (e.g., oxidation rate) and the thermal budget associated with the oxidation. What is needed is a method and apparatus for reoxidizing a surface of a semiconductor with material having a nitrogen-containing material in an efficient manner in terms of oxidation rate and thermal budget.

SUMMARY

A method of forming an oxide in the presence of a nitrogen-containing material is disclosed. In one embodiment, an oxygen-containing gas and a hydrogen-containing gas are provided to the chamber and reacted in the chamber. The reactive gases are used to oxidize the surface of a substrate in the chamber, the substrate having a nitrogen-containing material or a nitride film on a surface. In another embodiment, only an oxygen-containing gas, such as nitrous oxide ($N_2O$) is used in the reoxidation reaction. According to the invention, the oxide is formed at the substrate and the nitrogen-containing material is displaced from the interface of the substrate and the oxide/nitrogen-containing material. By reacting an oxygen-containing gas with a hydrogen-containing gas in the chamber or "in situ," or by carrying out the reoxidation in an $N_2O$ environment, the reoxidation reaction rapidly produces an oxide within an acceptable thermal budget.

A system for forming an oxide on a substrate as part of a reoxidation process is also disclosed. In one embodiment, the system includes a chamber configured to house a substrate for processing, an oxygen-containing gas source coupled to the chamber, a hydrogen-containing gas source coupled to the chamber, and a system controller configured to control the introduction of an oxygen-containing gas and a hydrogen-containing gas into the chamber. A memory is also incorporated into the system of the invention comprising a computer-readable program embodied therein for directing the operation of the system. The memory includes instructions for introducing the oxygen-containing gas and the hydrogen-containing gas into the chamber to oxidize the surface of a substrate in the presence of a nitrogen-containing material on the surface of the substrate.

In another embodiment of the system, only an oxygen-containing gas, such as $N_2O$ is used in the reoxidation reaction. The system controller is configured to control the introduction of the oxygen-containing gas into the chamber and the system includes a memory comprising a computer-readable program embodied therein that directs the operation of the system, including instructions for introducing the oxygen-containing gas into the chamber to oxidize a substrate.

Additional features and benefits of the invention will become apparent from the detailed description, figures, and claims set forth below.

DETAILED DESCRIPTION

The invention describes novel methods and an apparatus for reoxidizing a substrate having a nitrogen-containing material or a nitride film. In general, the methods described relate to reoxidation processes that may be accomplished rapidly consistent with an efficient thermal budget. In the following description, numerous specific details such as apparatus configurations as well as process specifics such as time and temperature are set forth in order to provide a thorough understanding of the invention. One skilled in the art will appreciate the ability to use alternative configurations and process details to the disclosed specifics without departing from the invention. In other instances, well known semiconductor processing equipment and techniques have not been described in detail in order to not unnecessarily obscure the invention.

Figure 1:
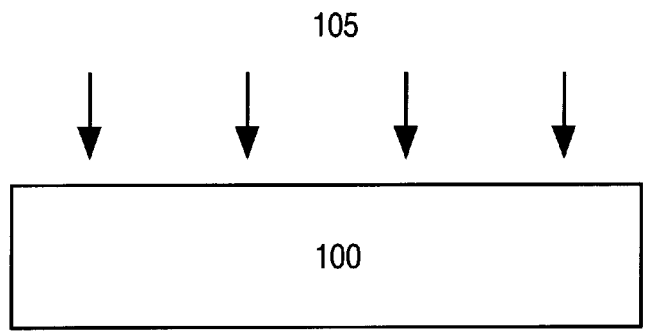
FIG. 1 is a side view illustration of a semiconductor substrate undergoing a process step of forming a nitride film on a surface of the substrate.
Figure 2:
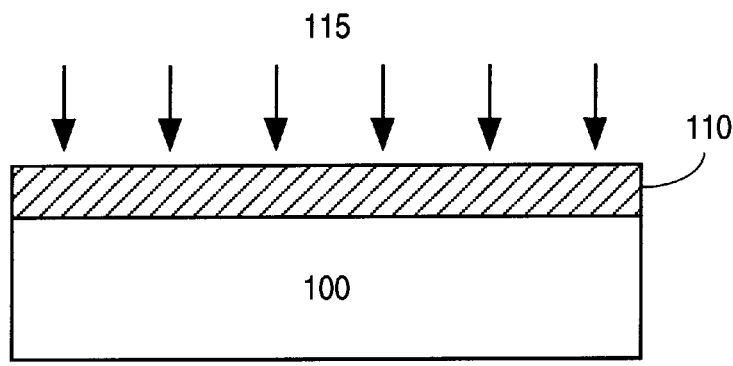
FIG. 2 is an illustration of the substrate of FIG. 1 after the processing step of forming a nitride film on a surface of the substrate and undergoing a reoxidation process in accordance with an embodiment of the invention.
Figure 3:
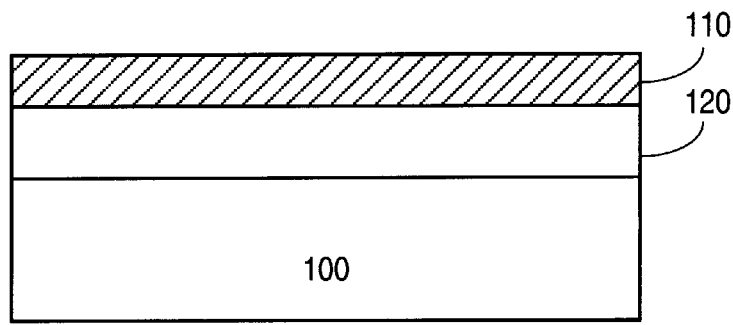
FIG. 3 is an illustration of the substrate after the processing step of reoxidizing a surface of the substrate in accordance with an embodiment of the invention.

The invention relates to a reoxidation process. The invention is particularly suitable for the reoxidation of a semiconductor substrate having a nitrogen-containing material or nitride film on a surface. FIGS. 1–3 illustrate an embodiment of the reoxidation process of the invention. First, a semiconductor substrate, such as for example silicon substrate 100, is subjected to a deposition 105 of a nitrogen-containing material or a nitride film. In one embodiment, the nitrogen-containing material or nitride film is silicon nitride ($Si_3N_4$) or silicon oxynitride ($Si_xN_yO_z$). The deposition conventionally is carried out by one of several methods, most commonly plasma-enhanced chemical vapor deposition (PECVD), e.g., $NH_3$ nitridation in dichlorosilane to form $Si_3N_4$, or NO oxynitridation in polysilicon to form $Si_xN_yO_z$. FIG. 2 shows semiconductor substrate 100 having a $Si_3N_4$ or $Si_xN_yO_z$ film 110 overlying a surface of the substrate. As used herein, the interface is the common boundary between the substrate and layer adjacent the substrate, in this case, the boundary between substrate 100 and $Si_3N_4$ or $Si_xN_yO_z$ film 110 is described as the $Si_3N_4$ or $Si_xN_yO_z$ film/Si interface.

FIG. 2 also shows the further processing step of exposing substrate 100 to a reoxidation process 115. Reoxidation process 115 forms an oxide ($SiO_2$) at the interface. In other words, $SiO_2$ is formed at the boundary between $Si_3N_4$ or $Si_xN_yO_z$ film 110 and substrate 100 to form a $SiO_2/Si$ interface. Thus, in one embodiment, FIG. 3 demonstrates substrate 100 having oxide layer 120 at its interface and $Si_3N_4$ or $Si_xN_yO_z$ film 110 illustratively overlying oxide layer 120. The presence of nitrogen in $Si_3N_4$ or $Si_xN_yO_z$ film 110, illustratively shown here overlying oxide layer 120, acts as an effective barrier layer to prevent the migration of dopants, such as boron, through oxide layer 120. By separating the nitrogen-containing material (e.g., $Si_3N_4$ or $Si_xN_yO_z$ film 110) from the interface of substrate 100, the negative effects on device performance seen in prior art structures are removed. It is to be appreciated that the invention is not limited to a reoxidation process that results in a strict replacement of the nitrogen-containing film or layer from the interface with oxide, i.e., that the reoxidation takes place in such a way to produce distinct layers of nitrogen-containing material and oxide. Instead, as will be discussed in detail below, in certain embodiments, the nitrogen atoms or nitrogen-containing material moves within the oxide during the reoxidation process to produce a higher concentration of nitrogen-containing molecules within the dielectric layer than at the surface.

In one embodiment, the invention describes a reoxidation process in the presence of in situ generated steam ($H_2O$). According to this embodiment, steam is formed in the same chamber that the substrate to be oxidized is located (i.e., steam is formed in situ with the substrate). According to this embodiment, a reactant gas mixture comprising a hydrogen-containing gas, such as but not limited to $H_2$ and $NH_3$, and an oxygen-containing gas, such as but not limited to $O_2$ and $N_2O$, is fed into a reaction chamber in which a substrate is located. A portion of the oxygen-containing gas and a portion of the hydrogen-containing gas are caused to react to form moisture or steam ($H_2O$) in the reaction chamber. The reaction of the hydrogen-containing gas and the oxygen-containing gas is ignited or catalyzed by heating the substrate to a temperature sufficient to cause the moisture reaction. Because the heated substrate is used as the ignition source for the reaction, the moisture generation reaction occurs in close proximity to the substrate surface. Reactant gas concentrations and partial pressures are controlled so as to prevent spontaneous combustion within the chamber. By keeping the chamber partial pressure of the reactant gas mixture at less than or equal to 150 Torr during the reaction, any reactant gas concentration may be utilized to form moisture without causing spontaneous combustion. In this embodiment, the in situ steam generation process of the invention preferably occurs in a reduced pressure single wafer chamber of a rapid thermal processor. A rapid thermal steam process utilizing in situ steam generation is ideally suited for reoxidizing a silicon film or substrate in the presence of a nitrogen-containing material or nitride film in the formation of modern ultra-high density integrated circuits.

The in situ steam generation reoxidation process of the invention is preferably carried in a rapid thermal processing (RTP) apparatus, such as but not limited to, the Applied Materials, Inc. RTP Centura with a Honeycombed Source. Another suitable RTP apparatus and its method of operation is set forth in U.S. Pat. No. 5,155,336, assigned to the Assignee of the invention. Additionally, although the in situ steam generation reaction of the invention is preferably carried out in a RTP apparatus, other types of thermal reactors may be utilized such as the Epi or Poly Centura Single Wafer "Cold Wall" Reactor by Applied Materials, Inc. used to form high temperature films (HTF) such as epitaxial silicon, polysilicon, oxides, and nitrides.

Figure 4:
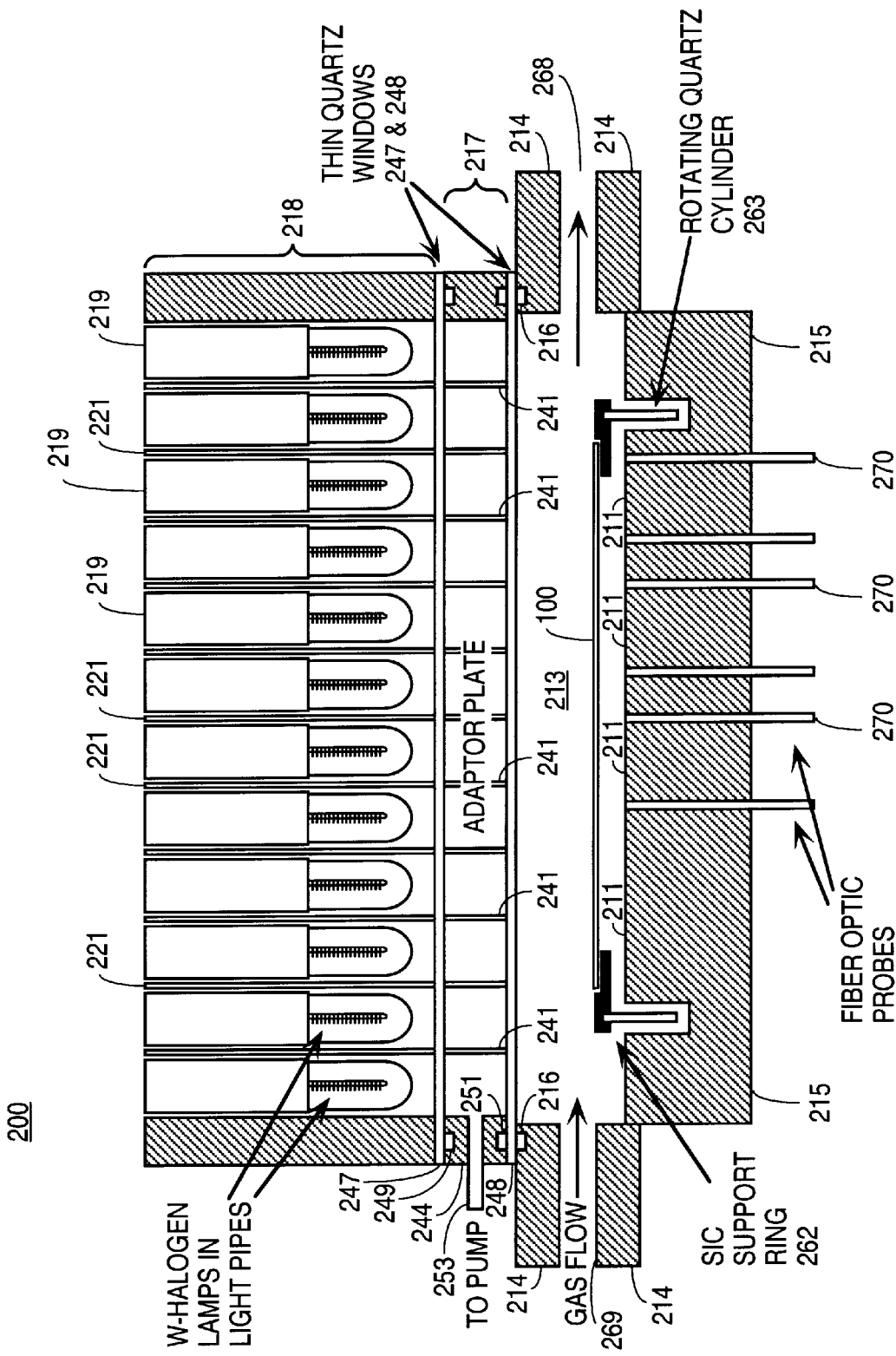
FIG. 4 is an illustration of a rapid thermal heating apparatus that can implement the in situ oxidation process of an embodiment of the invention.
Figure 5:
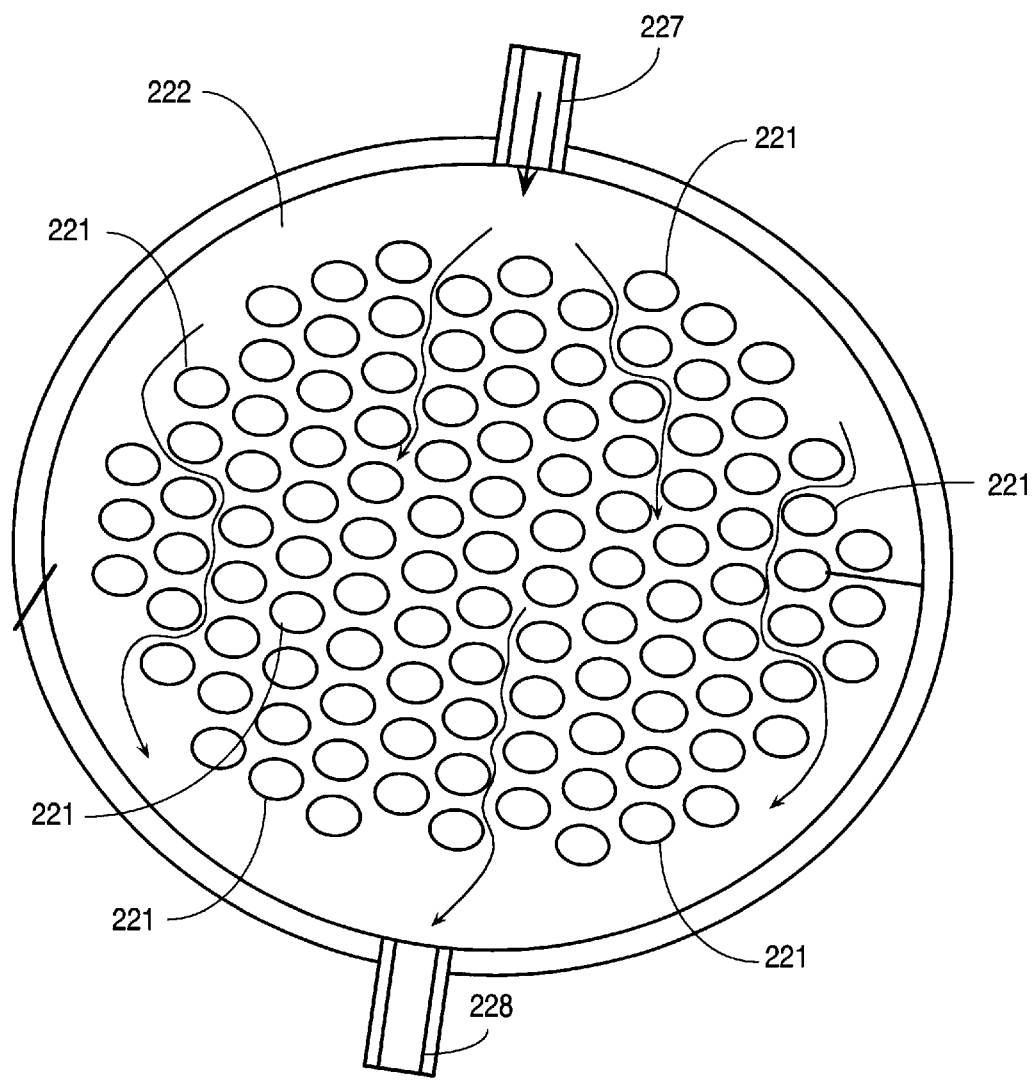
FIG. 5 is an illustration of the light source placement in the rapid thermal heating apparatus of FIG. 4.

FIGS. 4 and 5 illustrate a RTP apparatus and a light source placement for an apparatus, respectively, that can be used to carry out the in situ steam reoxidation process of an embodiment of the invention. RTP apparatus 200, as shown in FIG. 4, includes an evacuated process chamber 213 enclosed by side wall 214 and bottom wall 215. Side wall 214 and bottom wall 215 are preferably made of stainless steel. The upper portion of side wall 214 of chamber 213 is sealed to window assembly 217 by "O" rings 216. Light pipe assembly 218 is positioned over and coupled to window assembly 217. Light pipe assembly 218 includes a plurality of tungsten halogen lamps 219, for example, Sylvania EYT lamps, each mounted into light pipe 221 that can be stainless steel, brass, aluminum, or other metal.

Substrate or wafer 100 (e.g., silicon substrate or wafer) is supported on its edge inside chamber 213 by support ring 262 typically made of silicon carbide. Support ring 262 is mounted on a rotatable quartz cylinder 263. By rotating quartz cylinder 263, support ring 262 and substrate or wafer 100 can be caused to rotate. An additional silicon carbide adapter ring can be used to allow wafers of different diameters to be processed (e.g., 150 mm as well as 200 mm). The outside edge of support ring 262 preferably extends less than two inches from the outside diameter of substrate or wafer 100. The volume of chamber 213 is approximately two liters.

Bottom wall 215 of RTP apparatus 200 includes a gold-coated top surface 211 for reflecting energy onto the backside of substrate or wafer 100. Additionally, RTP apparatus 200 includes a plurality of fiber optic probes 270 positioned through bottom wall 215 of apparatus 200 in order to detect the temperature of substrate or wafer 100 at a plurality of locations across its bottom surface. Reflections between the backside of substrate or wafer 100 and reflecting surface 211 create a black body cavity that makes temperature measurement independent of wafer backside emissivity and thereby provides accurate temperature measurement capabilities.

RTP apparatus 200 includes gas inlet 269 formed through side wall 214 for injecting process gas into chamber 213 to allow various processing steps to be carried out in chamber 213. Coupled to gas inlet 269 is a source, such as a tank of oxygen-containing gas such as $O_2$, and a source, such as a tank of hydrogen-containing gas such as $H_2$. Positioned on the opposite side of gas inlet 269, in side wall 214, is gas outlet 268. Gas outlet 268 is coupled to a vacuum source, such as a pump, to exhaust process gas from chamber 213 and to reduce the pressure in chamber 213. The vacuum source maintains a desired pressure while process gas is continually fed into the chamber during processing.

Lamps 219 include a filament wound as a coil with its axis parallel to that of the lamp envelope. Most of the light is emitted perpendicular to the axis towards the wall of the surrounding light pipe. The light pipe length is selected to be at least as long as the associated lamp. The light pipe may be longer provided that the power reaching the wafer is not substantially attenuated by increased reflection. Light pipe assembly 218 preferably includes 187 lamps positioned in an hexagonal array or in a "honey-comb" shape as illustrated in FIG. 5. Lamps 219 are positioned to adequately cover the entire surface area of substrate or wafer 100 and support ring 262. Lamps 219 are grouped in zones that can be independently controlled to provide for extremely uniform heating of substrate or wafer 100. Light pipes 221 can be cooled by flowing a coolant, such as water, between the various heat pipes. The coolant is introduced through inlet 227 and removed through outlet 228. Light pipe assembly 218 comprising the plurality of light pipes 221 and associated lamps 219 allows the use of thin quartz windows to provide an optical port for heating a substrate within the evacuated process chamber.

Window assembly 217 includes a plurality of short light pipes 241 that are brazed to upper/lower flange plates that have their outer edges sealed to outer wall 244. A coolant, such as water, can be injected into the space between light pipes 241 to serve to cool light pipes 241 and flanges. Light pipes 241 register with light pipes 221 of the illuminator. The water-cooled flange with the light pipe pattern that registers with the lamp housing is sandwiched between two quartz plates 247 and 248. These plates are sealed to the flange with "O" rings 249 and 251 near the periphery of the flange. Plates 247 and 248 include grooves that provide communication between the light pipes. A vacuum can be produced in the plurality of light pipes 241 by pumping through a tube 253 connected to one of the light pipes 241 which is in turn connected to the rest of the pipes by a very small recess or groove in the face of the flange. Thus, when the sandwiched structure is placed on a chamber 213, the metal flange (typically stainless steel and of excellent mechanical strength) provides adequate structural support. Lower plate 248—the one actually sealing chamber 213—experiences little or no pressure differential because of the vacuum on each side and thus can be made very thin. The adapter plate concept of window assembly 217 allows quartz windows to be easily changed for cleaning or analysis. In addition, the vacuum between plates 247 and 248 of the window assembly provides an extra level of protection against toxic gases escaping from the reaction chamber.

RTP apparatus 200 is a single wafer reaction chamber capable of ramping the temperature of substrate or wafer 100 at a rate of 25–100° C./second. RTP apparatus 200 is said to be a "cold wall" reaction chamber because the temperature of the substrate or wafer during the oxidation process is at least 400° C. greater than the temperature of chamber side wall 214. Heating/cooling fluid can be circulated through side walls 214 and/or bottom wall 215 to maintain the walls at a desired temperature.

For a steam reoxidation process utilizing the in situ steam generation technique of the invention, chamber walls 14 and 15 are maintained at a temperature greater than room temperature (about 23° C.) in order to prevent condensation. RTP apparatus 200 is preferably configured as part of a "cluster tool" that includes a load lock and a transfer chamber with a robotic arm.

Figure 6:
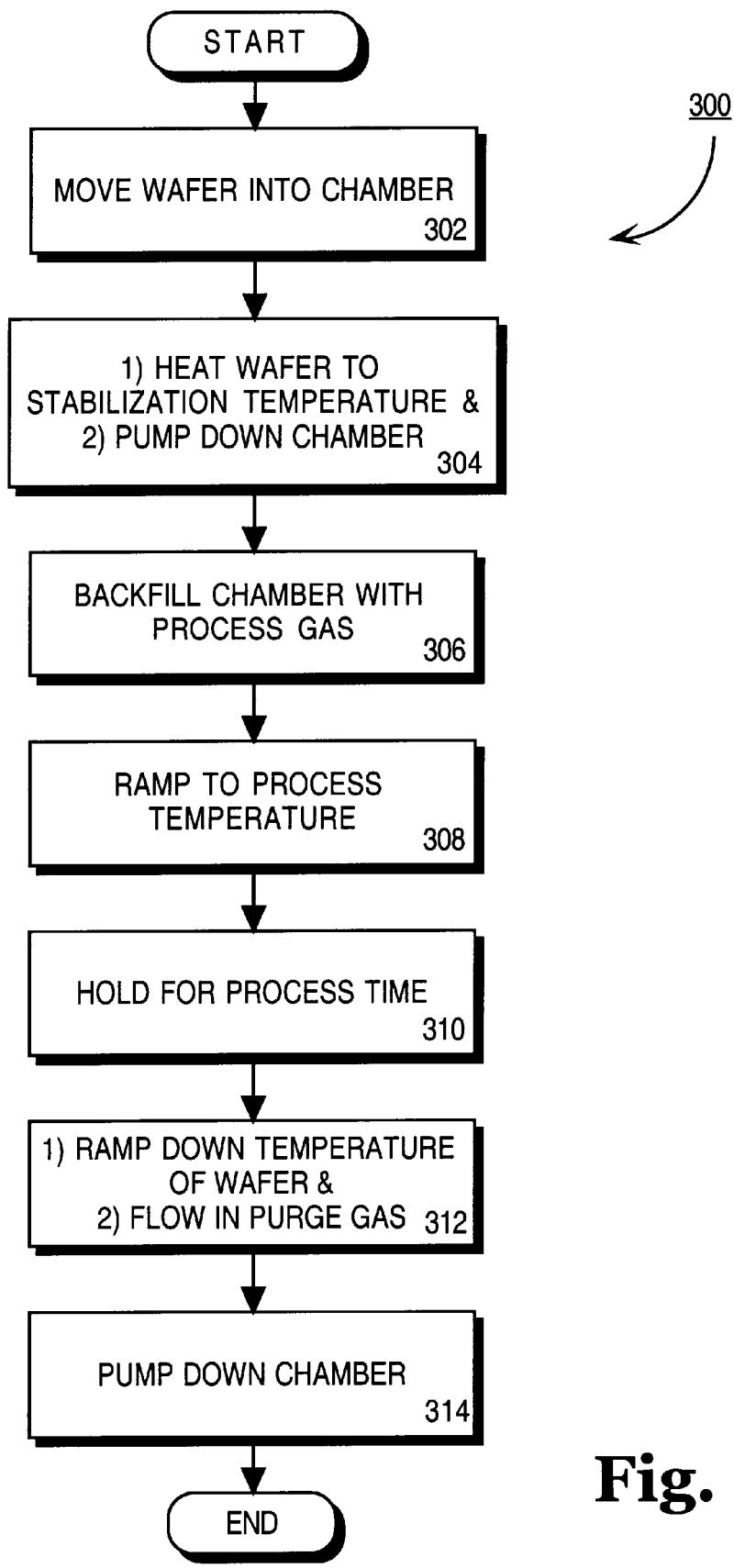
FIG. 6 is a flow chart that illustrates an oxidation process that utilizes the in situ moisture generation process of the invention.

A method of in situ generation of moisture or steam in a rapid thermal reoxidation process according to an embodiment of the invention is illustrated in flow chart 300 of FIG. 6. The method of this embodiment will be described with respect to an in situ steam generation process in the RTP apparatus illustrated in FIGS. 4 and 5. Additionally, the reoxidation process of the invention will be described with respect to the reoxidation of silicon substrate or wafer 100 as shown in FIGS. 1–3. Such a process might be used, for example, to create gate dielectrics for high performance transistor devices.

The deposition of a nitrogen-containing material or nitride film may be accomplished in the same reaction chamber as the reoxidation. Thus, the first step according to this embodiment of the invention, as set forth in block 302, is to move a substrate or wafer, such as substrate or wafer 100 into chamber 213. As is typical with modern cluster tools, substrate or wafer 100 will be transferred by a robotic arm from a load lock through a transfer chamber and placed face up onto silicon carbide support ring 262 located in chamber 213 as shown in FIG. 4. Substrate or wafer 100 will generally be transferred into chamber 213 having a nitrogen ($N_2$) ambient at a transfer pressure at approximately 20 Torr. Chamber 213 is then sealed.

Next, as set forth in block 304, the pressure in chamber 213 is further reduced by evacuating the $N_2$ ambient through gas outlet 268. Chamber 213 is evacuated to a pressure to sufficiently remove the $N_2$ ambient.

In accordance with the invention, silicon substrate or wafer 100 is oxidized in $NH_3$ gas or $N_2O$ gas at approximately 800° C. to form a $Si_3N_4$ film or $Si_xN_yO_z$ film on substrate or wafer 100, respectively, of a thickness of approximately 10–20 Å. The temperature is then ramped down, the gas purged, and the chamber pumped down to prepare for the reoxidation process.

Chamber 213 is pumped down to a prereaction pressure less than the pressure at which the in situ steam generation is to occur and is preferably pumped down to a pressure less than 1 Torr (Step 304). Simultaneous with the prereaction pump-down, power is applied to lamps 219 which in turn irradiate substrate or wafer 100 and silicon carbide support ring 262 and thereby heat substrate or wafer 100 and support ring 262 to a stabilization temperature (Step 304). The stabilization temperature of substrate or wafer 100 is less than the temperature (reaction temperature) required to initiate the reaction of the hydrogen-containing gas and the oxygen-containing gas to be utilized for the in situ steam generation reoxidation. The stabilization temperature in one embodiment of the invention is approximately 500° C.

Once the stabilization temperature and the prereaction pressure are reached, chamber 213 is backfilled with the desired mixture of process gas (Step 306). In one embodiment, the process gas includes a reactant gas mixture comprising two reacting gases: A hydrogen-containing gas and an oxygen-containing gas that can be reacted together to form steam or water vapor at temperatures between 400–1250° C. The hydrogen-containing gas is preferably hydrogen gas ($H_2$), or may be other hydrogen-containing gases such as, but not limited to, $NH_3$, deuterium (heavy hydrogen), and hydrocarbons such as methane ($CH_4$). The oxygen-containing gas is preferably oxygen gas ($O_2$) but may be other types of oxygen-containing gases, such as but not limited to, nitrous oxide ($N_2O$). Other gases, such as but not limited to, nitrogen ($N_2$), may be included in the process gas mix if desired, for example, to boost the nitrogen content of the dielectric formed on substrate or wafer 100. The oxygen-containing gas and the hydrogen-containing gas are preferably mixed together in chamber 213 to form the reacting gas mixture.

The partial pressure of the reacting gas mixture (i.e., the combined partial pressure of the hydrogen-containing gas and the oxygen-containing gas) is controlled to ensure safe reacting conditions. According to the invention, chamber 213 is backfilled with process gas such that the partial pressure of the reacting gas mixture is less than the partial pressure at which spontaneous combustion of the entire volume of the desired concentration ratio of reactant gas will not produce a detonation pressure wave of a predetermined amount. The predetermined amount is the amount of pressure that chamber 213 can reliably handle without failing.

Figure 7:
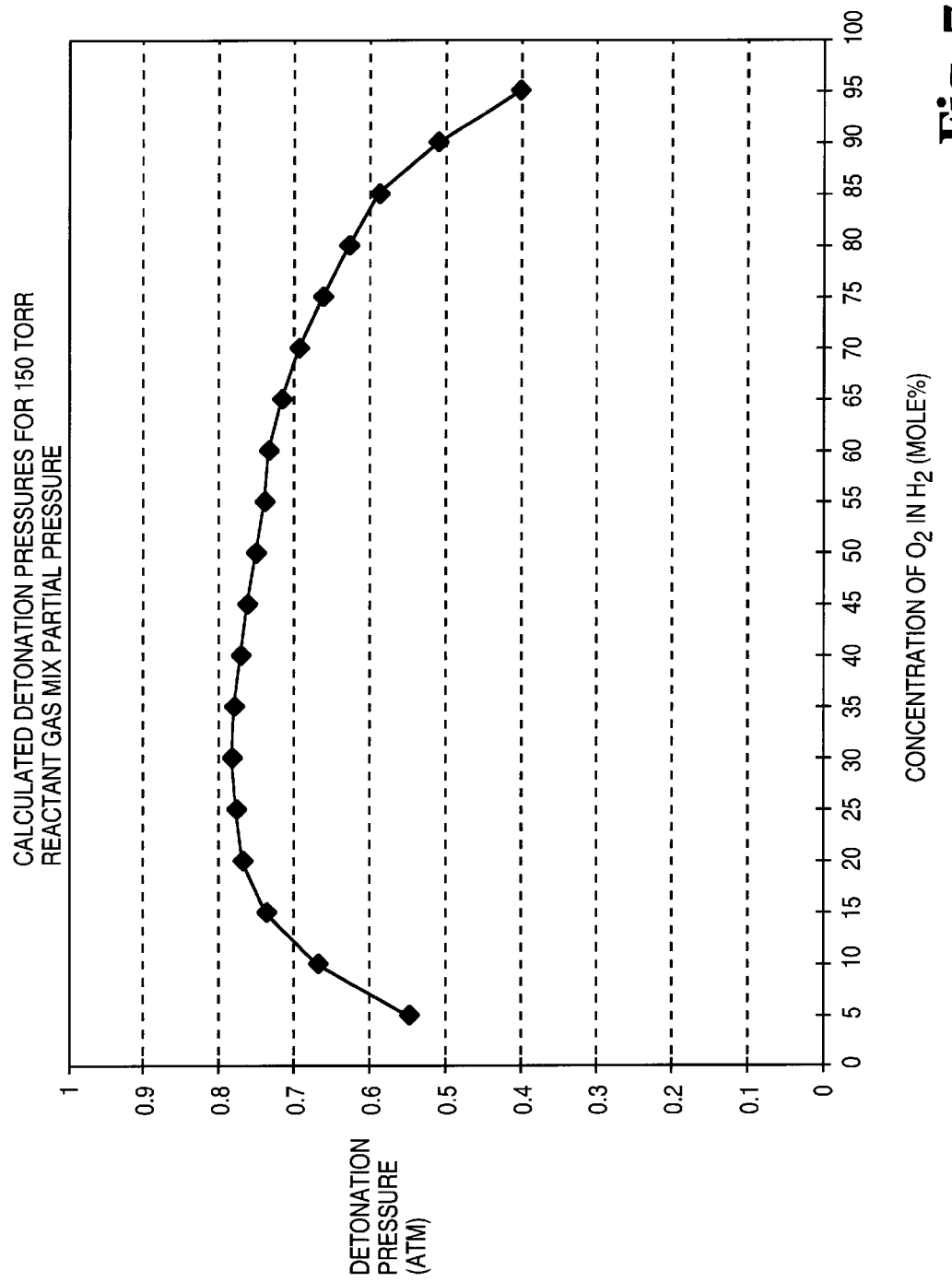
FIG. 7 is a graph that illustrates the detonation pressure created for various $O_2/H_2$ concentration ratios having a partial pressure of 150 Torr.

FIG. 7 is a graph that shows detonation pressures for different reactant gas mixtures of $O_2$ and $H_2$ at partial pressures of 150 Torr for the spontaneous combustion of the entire volume, about two liters, of chamber 213 at a process temperature of 950° C. According to an embodiment of the invention, in situ steam generations are preferably carried out in a reaction chamber that can reliably handle a detonation pressure wave of four atmospheres or more without affecting its integrity. In such case, reactant gas concentrations and operating partial pressures preferably do not provide a detonation wave greater than two atmospheres for the spontaneous combustion of the entire volume of the chamber.

By controlling the chamber partial pressure of the reactant gas mixture, various concentration ratios of hydrogen-containing gas and oxygen-containing gas can be used including, but not limited to, hydrogen rich mixtures utilizing $H_2/O_2$ ratios greater than 2:1, respectively, and oxygen rich mixtures using $H_2/O_2$ ratios less than 0.5:1. For example, FIG. 7 shows that any concentration ratio of $O_2$ and $H_2$ can be safely used as long as the chamber partial pressure of the reactant gases is maintained at less than 150 Torr at process temperature. The ability to use any concentration ratio of oxygen-containing gas and hydrogen-containing gas enables one to produce an ambient with any desired concentration ratio of $H_2/H_2O$ or any concentration ratio of $O_2/H_2O$ desired. Where the ambient is oxygen rich or hydrogen rich, dilute steam can greatly affect device electrical characteristics. The invention enables a wide variety of different steam ambients to be produced and therefore a wide variety of different oxidation processes to be implemented.

In some oxidation processes, an ambient having a low steam concentration with a balanced $O_2$ may be desired. Such an ambient can be formed by utilizing a reactant gas mixture comprising 10% or less $H_2$ and 90% or more $O_2$. In other processes, an ambient of hydrogen rich steam (e.g., 70–80% $H_2$/30–20% $H_2O$) may be desired. A hydrogen rich, low steam concentration ambient can be produced according to the invention by utilizing a reactive gas mix comprising between 5–20% $O_2$ with the remainder $H_2$ (95–80%). It is to be appreciated that any ratio of hydrogen-containing gas and oxygen-containing gas may be utilized because the heated wafer provides a continual ignition source to drive the reaction. This is in contrast to prior art pyrogenic torch methods that restrict the available gas ratios in order to keep a stable flame burning.

Next, as set forth in block 308, power to lamp 219 is increased so as to ramp up the temperature of substrate or wafer 100 to process temperature. Substrate or wafer 100 is preferably ramped form the stabilization temperature to process temperature at a rate of between 10–100° C./second with a 50° C./second rate being preferred. The preferred process temperature of the invention is between 1000–1150° C. with 1050° C. being preferred. The process temperature must be at least the reaction temperature (i.e., must be at least the temperature at which the reaction between the oxygen-containing gas and the hydrogen-containing gas can be initiated by substrate or wafer 100) which is typically at least 600° C. It is to be noted that the actual reaction temperature depends upon the partial pressure of the reacting gas mixture as well as on the concentration ratio of the reacting gas mixture, and can be between 400° C. to 1250° C.

As the temperature of substrate or wafer 100 is ramped up to process temperature, it passes through the reaction temperature and causes the reaction of the hydrogen-containing gas and the oxygen-containing gas to form moisture or steam. Since RTP apparatus 200 is a "cold wall" reactor, the only sufficiently hot surfaces in chamber 213 to initiate the reaction are substrate or wafer 100 and support ring 262. As such, in the invention, the moisture or steam generating reaction occurs near, e.g., about one centimeter from, the surface of substrate or wafer 100. In this embodiment, the steam generating reaction is confined to within about two inches of substrate or wafer 100 or about the amount at which support ring 262 extends past the outside edge of substrate or wafer 100. Since it is the temperature of substrate or wafer 100 (and support ring 262) that initiates or turns "on" the steam generation reoxidation reaction, the reaction is said to be thermally controlled by the temperature of substrate or wafer 100 (and support ring 262). Additionally, the vapor generation reaction of the invention is said to be "surface catalyzed" because the heated surface of the wafer is necessary for the reaction to occur, however, it is not consumed in the reaction which forms the water vapor or steam.

Next, as set forth in block 310, once the desired process temperature has been reached, the temperature of substrate or wafer 100 is held constant for a sufficient period of time to enable the water vapor or steam generated from the reaction of the hydrogen-containing gas and the oxygen-containing gas to reoxidize the silicon surface to form an oxide layer. Substrate or wafer 100 typically will be held at process temperature for between 30 to 120 seconds. Process time and temperature are generally dictated by the thickness of the oxide film desired, the thermal budget, the purpose of the oxidation, and the type and concentrations of the process gases.

Figure 8A:
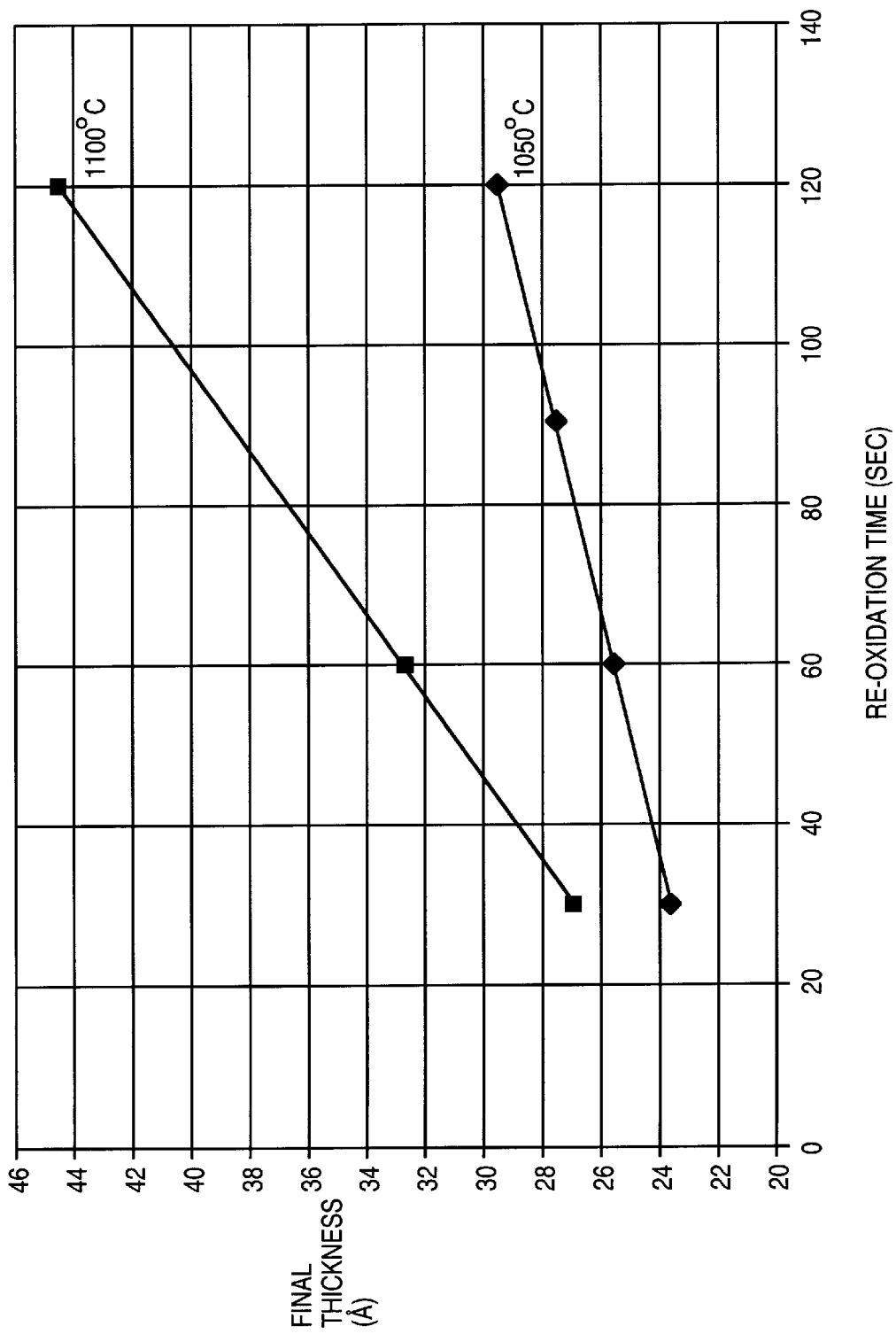
FIG. 8a is a graphical representation of the reoxidation rate in dry oxygen gas of a silicon substrate having a $Si_xN_yO_z$ film.

FIG. 8a shows a graph of the reoxidation rate of a silicon substrate containing a 18 Å $Si_xN_yO_z$ film at 1050° C. and 1100° C. The graph plots the final thickness of a dielectric (oxide plus $Si_xN_yO_z$) versus time. The reoxidation is carried out in 100% $O_2$ or dry $O_2$. In one embodiment, the $Si_xN_yO_z$ film (e.g., film 110) is formed by an oxidation in NO at approximately 800° C. for 30 seconds. Reoxidation of the silicon substrate or wafer at 1050° C. yields a final thickness of oxide plus $Si_xN_yO_z$ of approximately 26 Å and 29 Å after 60 seconds and 120 seconds, respectively. Similarly, the reoxidation of the silicon substrate or wafer at 1100° C. yields a final thickness of oxide plus $Si_xN_yO_z$ of approximately 33 Å after 60 seconds and 44 Å after 120 seconds. Thus, the thermal budget for reoxidation under conditions employing only an oxygen-containing gas is very significant.

Figure 8B:
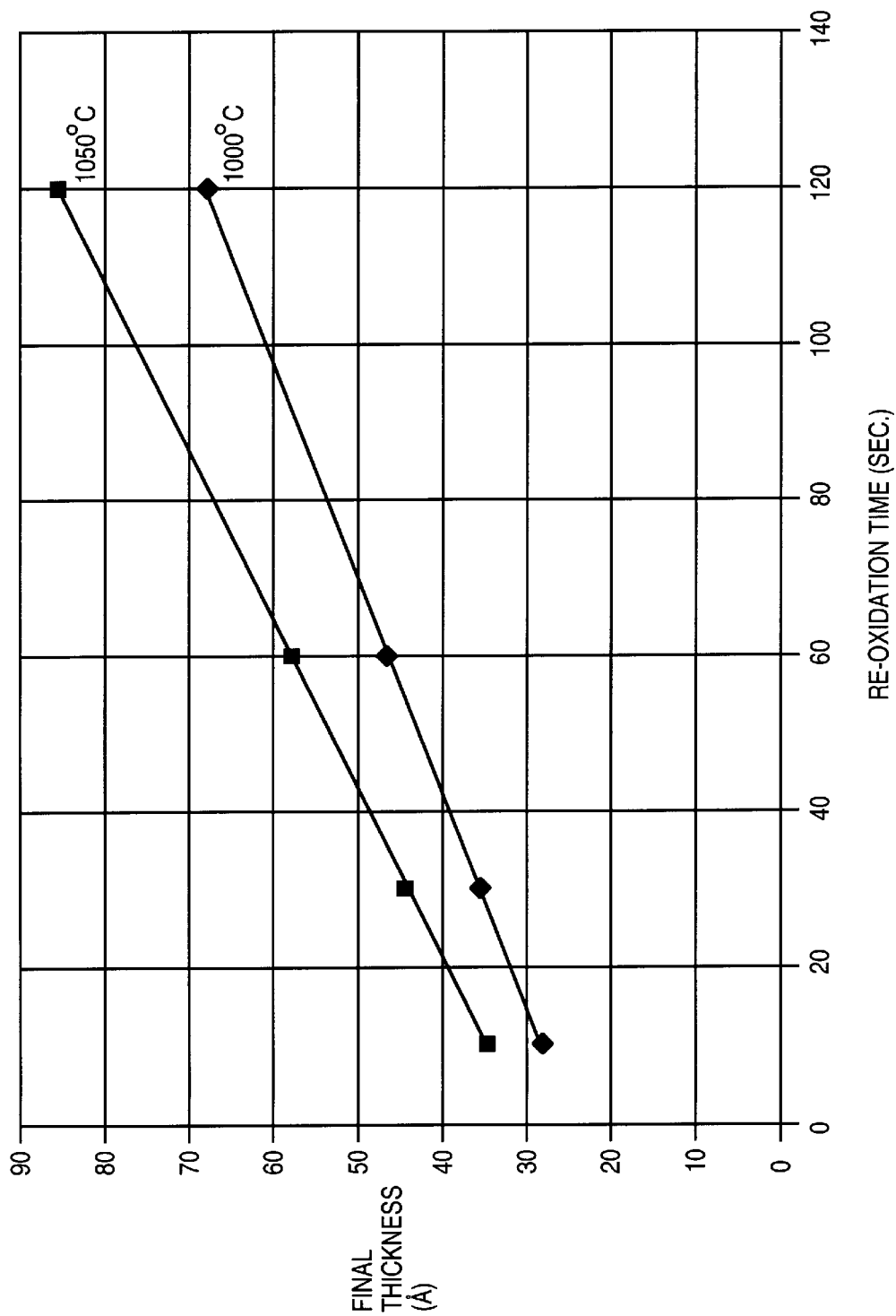
FIG. 8b is a graphical representation of an in situ steam generation reoxidation rate of a silicon substrate surface having a $Si_xN_yO_z$ film.

FIG. 8b shows a graph of final thickness of a dielectric (oxide plus $Si_xN_yO_z$) versus time of a reoxidation process carried out under in situ steam generation according to an embodiment of the invention with a reactant gas mixture of one part hydrogen-containing gas to two parts oxygen-containing gas and a total partial pressure of combined gases of 10 Torr. Again, the thickness of a $Si_xN_yO_z$ film (e.g., film 110) is approximately 18 Å after a 30 second oxidation in NO. At 1000° C., the in situ steam generation reoxidation, yields a final thickness (oxide plus oxynitride) of approximately 38 Å after 30 seconds. A 60 second reoxidation yields a final thickness at 1000° C. of approximately 49 Å. A reoxidation for 120 seconds at 1000° C. yields a final thickness of approximately 69 Å. After 30 seconds of reoxidation at 1050° C., a final thickness of approximately 45 Å. At 60 seconds, the same reacting gas mixture yields a final thickness of approximately 58 Å. At 120 seconds, the reoxidation yields a final thickness of approximately 85 Å.

The above examples demonstrate the improved effectiveness of a reoxidation carried out by an in situ steam generation process relative to a dry $O_2$ process (e.g., more oxide produced per unit time at a given temperature). It has also been observed that increasing the concentration of hydrogen-containing gas increases the reoxidation rate, i.e., the formation/growth of oxide. This has been demonstrated using hydrogen-containing gas concentrations ranging from, for example, 2% to 33% to establish the trend. It has also been demonstrated that a higher total flow rate increases the reoxidation rate such that, for example, more total gas at a constant pressure (i.e., one liter $H_2$/9 liters $O_2$ to two liters $H_2$/18 liters $O_2$) increases the reoxidation.

It is believed that the presence of hydrogen-containing gas and the reaction of the hydrogen-containing gas and the oxygen-containing gas to create water vapor or steam ($H_2O$) greatly enhances the reoxidation process. It is also believed that perhaps the possible existence of hydroxyl ($OH^-$) radicals in addition to steam or despite the steam causes the improved reoxidation of silicon.

Next, as set forth in block 312, power to lamps 219 is reduced or turned off to reduce the temperature of substrate or wafer 100. The temperature of substrate or wafer 100 decreases (ramps down) as fast as it is able to cool down (at about 50° C./seconds). Simultaneously, $N_2$ purge gas is fed into chamber 213. The steam generation reoxidation reaction ceases when substrate or wafer 100 and support ring 262 drop below the reaction temperature. Again, it is the wafer temperature (and support ring temperature) that dictates when the moisture reaction is turned "on" or "off".

As set forth in block 314, chamber 213 is then pumped down, preferably below 1 Torr, to ensure that no residual oxygen-containing gas and hydrogen-containing gas are present in chamber 213. Chamber 213 is then backfilled with $N_2$ gas to the desired transfer pressure of approximately 20 Torr and substrate or wafer 100 transferred out of chamber 213 to complete the process. At this time, a new substrate or wafer may be transferred into chamber 213 and the process set forth in flow chart 300 repeated.

Figure 9A:
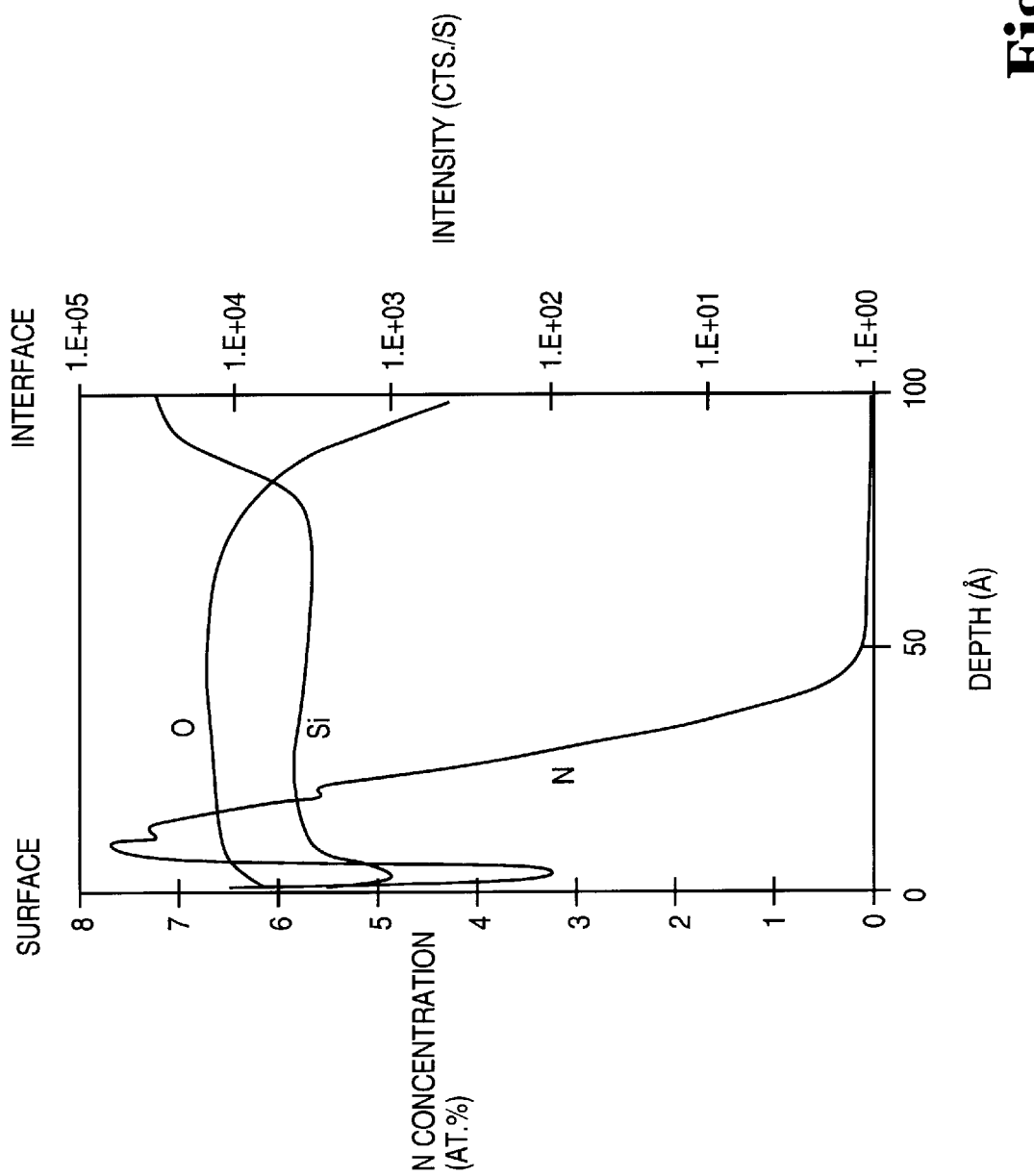
FIG. 9a is a Secondary Ion Mass Spectroscopy (SIMS) profile of a silicon substrate containing a dielectric layer formed by the reoxidation of a $Si_xN_yO_z$ film in dry oxygen.
Figure 9B:
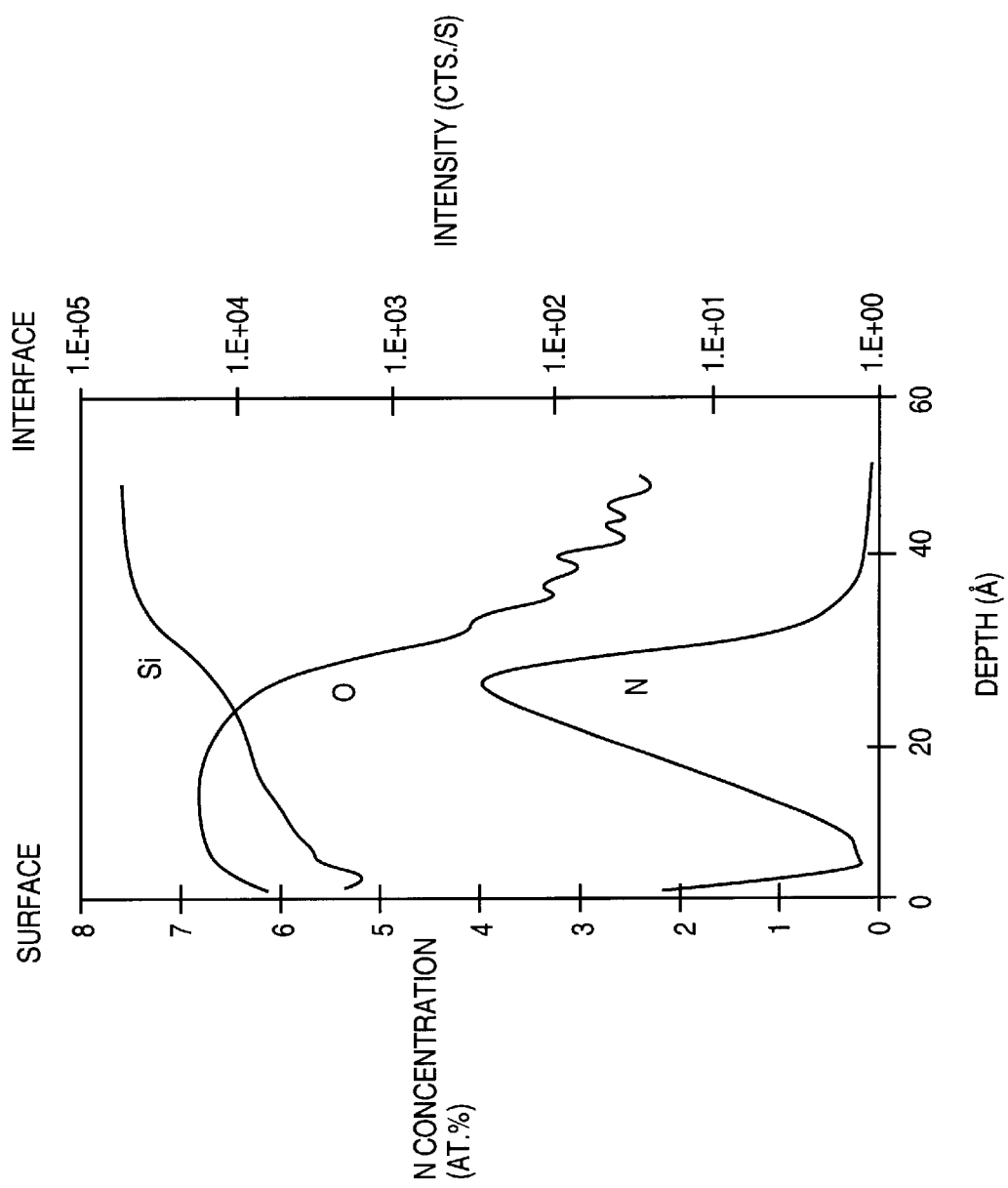
FIG. 9b is a SIMS profile of a silicon substrate containing dielectric layer formed by the reoxidation of a $Si_xN_yO_z$ film in an in situ steam generation process after 30 seconds.
Figure 9C:
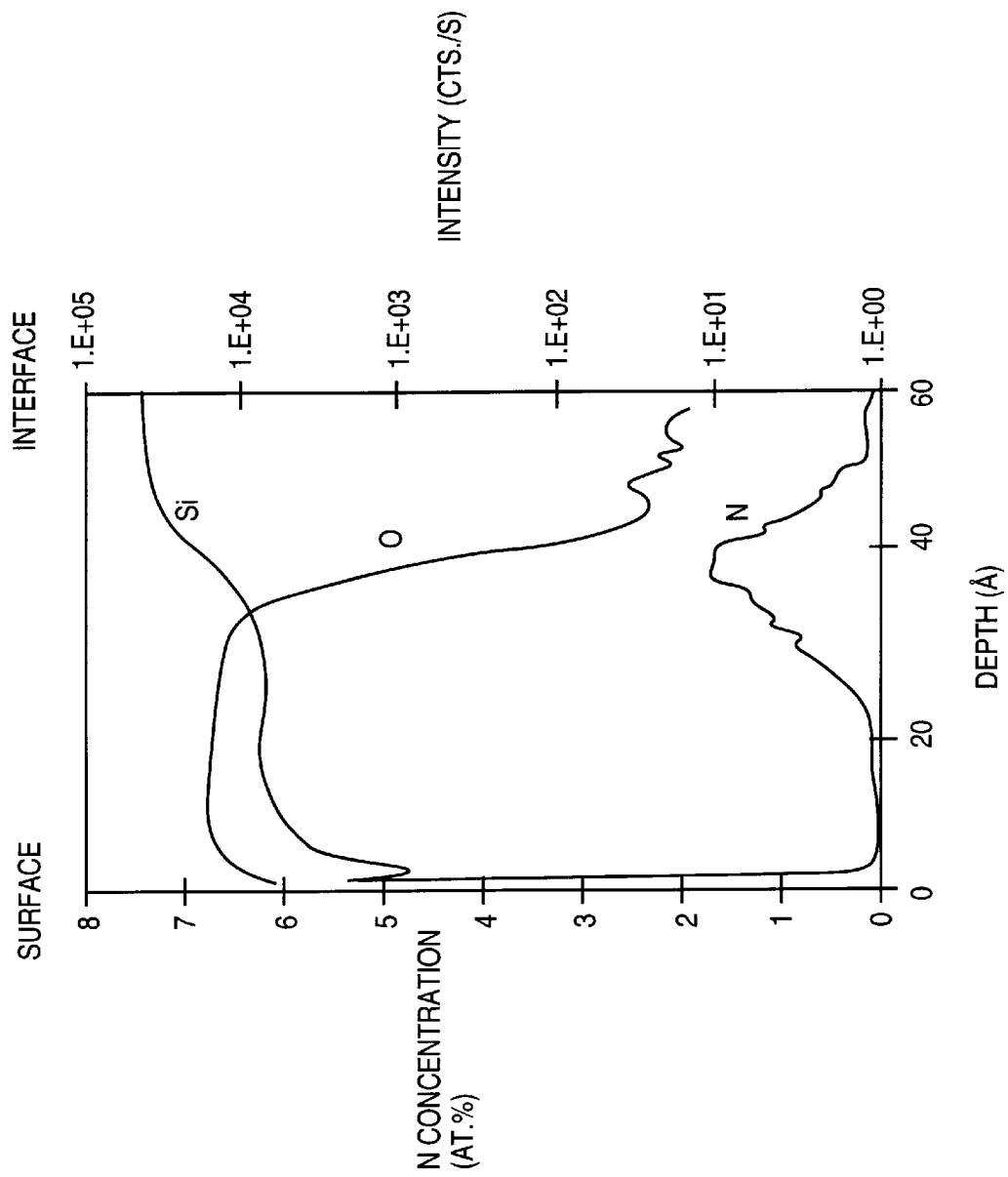
FIG. 9c is the SIMS profile of the silicon substrate containing the dielectric layer described in FIG. 9b after 120 seconds.

FIGS. 9a, 9b, and 9c show Secondary Ion Mass Spectroscopy (SIMS) profiles of silicon substrate containing a dielectric layer formed by reoxidation of a $Si_xN_yO_z$ film. The SIMS profiles illustrate the atomic profile of a dielectric from the surface (0 depth) to the interface of the dielectric layer and the silicon substrate. Thus, the depth represents the depth into the dielectric layer. FIG. 9a shows the profile of a nitrogen-containing dielectric formed on a wafer with a reoxidation after 300 seconds in the presence of dry $O_2$ under the reaction conditions described above with reference to FIG. 8a and the accompanying text. After 300 seconds, the dielectric layer is approximately 81 Å thick. FIG. 9a shows that the majority of the nitrogen-containing material ($Si_xN_yO_z$) is at the surface of the dielectric layer (i.e., within 10 Å of the depth of the 81 Å thick dielectric layer) and not at the dielectric layer/Si interface.

FIG. 9b shows the profile of a nitrogen-containing dielectric layer formed on a silicon substrate with a reoxidation after 30 seconds under the in situ steam generation process described above with reference to FIG. 8b and the accompanying text. After 30 seconds, the dielectric layer is approximately 38 Å thick. FIG. 9c shows the profile of the in situ reoxidation process after 120 seconds. After 120 seconds, the dielectric layer is approximately 68 Å thick. An analysis of the in situ steam generation reoxidation of FIG. 9b shows that the nitrogen-containing material does not dominate the surface of the dielectric layer, but instead is present in higher concentrations from 10 to 20 Å from the surface of the 38 Å dielectric layer. After 120 seconds, FIG. 9c shows that some nitrogen is lost during the in situ steam generation process, and that the nitrogen-containing material contained in the dielectric layer is present in higher concentrations from 20 to 40 Å from the surface of the 68 Å dielectric layer.

FIGS. 9b and 9c demonstrate that the in situ steam generation reoxidation process causes a rearrangement of the nitrogen within the dielectric layer or within the bulk (i.e., that area of the dielectric layer between the surface and the substrate interface). The presence of significant concentrations of nitrogen at the surface of the dielectric layer or within the dielectric layer bulk have similar effects on the electrical characteristics of the dielectric layer, particularly as the dielectric layer relates to gate oxide integrity. In the in situ steam generation reoxidation process in particular, the nitrogen-containing material is present in concentrations less than or equal to approximately 0.5 percent at the dielectric layer/Si interface. Experimental studies have revealed that nitrogen present at the interface of concentrations around 0.5 percent actually improve the electrical characteristics of, for example, a transistor device.

Figure 10A:
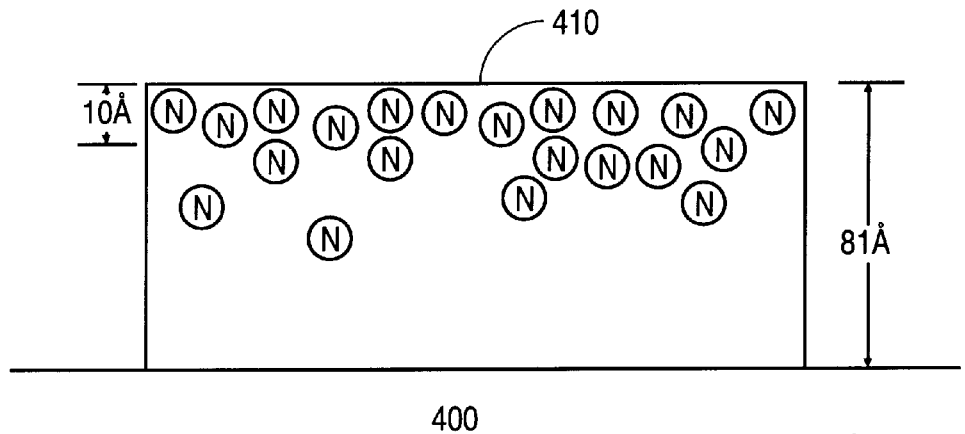
FIG. 10a is a schematic illustration of a dielectric layer overlying a silicon substrate, the dielectric layer formed by the reoxidation of a $Si_xN_yO_z$ film in dry oxygen.
Figure 10B:
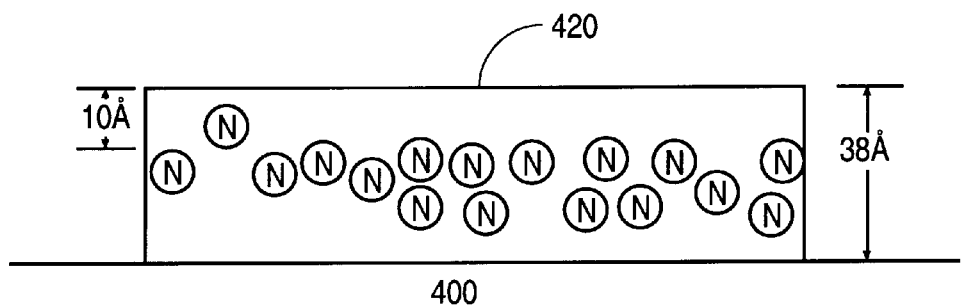
FIG. 10b is a schematic illustration of a dielectric layer overlying a silicon substrate, the dielectric layer formed by the reoxidation of a $Si_xN_yO_z$ film in an situ steam generation process after 30 seconds.
Figure 10C:
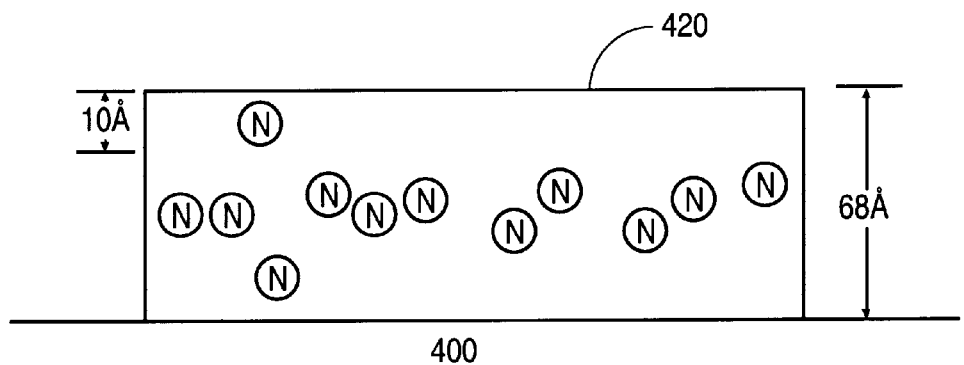
FIG. 10c shows a continued formation of the dielectric layer of FIG. 10b after 120 seconds.

FIGS. 10a, 10b, and 10c illustrate the dielectric layers having the SIMS profiles of FIGS. 9a, 9b, and 9c, respectively. FIG. 10a shows a schematic side view of dielectric layer 406 formed over silicon wafer 405 utilizing a reoxidation in dry $O_2$ of a $Si_xN_yO_z$ film under the reaction conditions described above with reference to FIG. 8a and the accompanying text. FIG. 10a shows that for an 81 Å thick dielectric layer formation, the highest concentration of nitrogen-containing material is located within 10 Å of the surface of dielectric layer 406. FIG. 10b schematically illustrates a side view of dielectric layer 407 formed on wafer 405 utilizing an in situ steam generation reoxidation process of a $Si_xN_yO_z$ film as described above with reference to FIG. 8b and the accompanying text. A 38 Å dielectric layer has nitrogen-containing material displaced away from the surface and more in the bulk. FIG. 10b shows the highest concentration of nitrogen-containing material from 10–20 Å from the surface of dielectric layer 407. FIG. 10c shows dielectric layer 408 formed with reference to FIG. 8b and the accompanying text after 120 seconds. For a 68 Å dielectric layer 408, the concentration of nitrogen-containing material in dielectric layer 420 has decreased, but that which remains is present in higher concentrations from 20–40 Å from the surface of the 68 Å dielectric.

Figure 11:
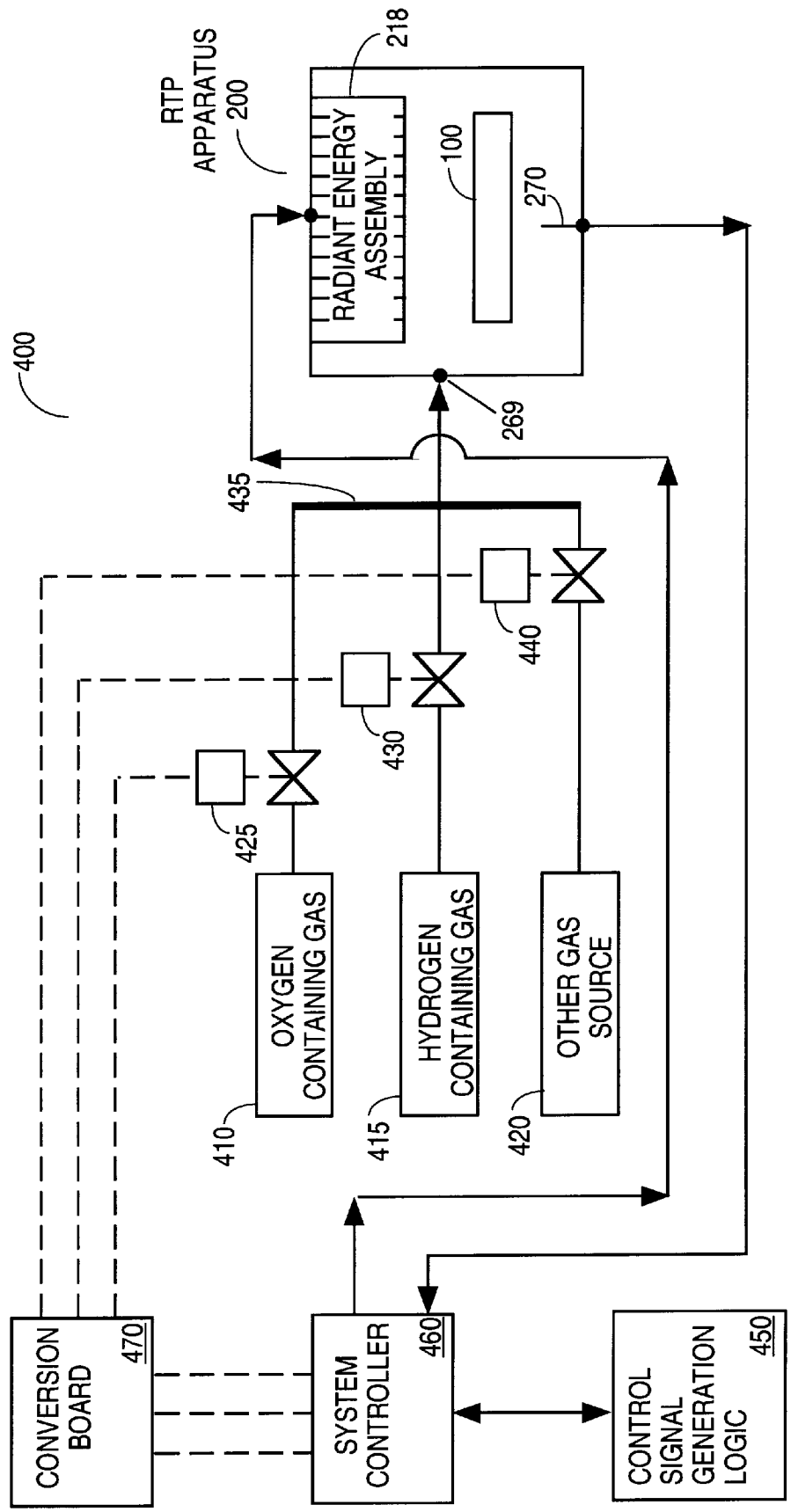
FIG. 11 illustrates an embodiment of a processing system according one embodiment of the invention.

FIG. 11 illustrates an embodiment of a system for generating a material layer on a substrate or wafer in a chamber of an RTP apparatus, such as a system for generating an oxide on a substrate or wafer in the presence of a nitrogen-containing material in accordance with the invention. Processing system 400 includes RTP apparatus 200 that houses substrate 100 to allow the processing step of the in situ steam reoxidation process of an embodiment of the invention. As described in detail above, RTP apparatus 200 includes, among other components, process chamber 213, light pipe assembly 218 to generate the radiant energy to drive the reoxidation reaction, and plurality of fiber optic probes 270 to detect the temperature of substrate or wafer 100 at a plurality of locations across the bottom surface of substrate or wafer 100. In this illustration, RTP apparatus 200 also includes gas inlet 269.

Coupled to gas inlet 269 is manifold 435 to support a plurality of gas sources as a single feed to RTP apparatus 200. FIG. 11 shows three process gases that are supplied to manifold 435. Included amongst the process gases are an oxygen-containing gas 410, a hydrogen-containing gas 415, and a third gas 420, such as, for example, an inert nitrogen gas. It is to be appreciated that the process gas or gases utilized in the invention may also be supplied directly to the reaction chamber (e.g., RTP apparatus 200) by individual feed lines. Each process gas (410, 415, and 420) has a flow controller 425, 430, and 440, respectively, coupled between the process gas source and manifold 435, such as a mass flow controller. Flow controllers 425, 430, and 440, respectively, receive, in one example, an analog signal from system controller 460 (such as, for example, a signal between 0 and 5 volts) that actuates a valve to control the flow rate or amount of gas released from the gas source to RTP apparatus 200. Conversion board 470 is placed, in this embodiment, between flow controllers 425, 430, and 440 to coordinate the signals between system controllers 460 and the flow controllers, in the instance, where, for example, the signals are scaled differently.

Control signal generation logic 450 is supplied to system controller 460 in the form of, for example, software instruction logic that is a computer program stored in a computer-readable medium such as memory 438 in system controller 460. Preferably, memory 438 is a hard disk drive, but memory may also be other kinds of memory. The computer program includes sets of instructions that dictate the timing, mixture of gases, chamber pressure, chamber temperature, RF power levels, and other parameters of a particular process. It is to be appreciated that other computer programs such as one stored on another memory device, including but not limited to, a floppy disk, may also be used to operate system controller 460. The interface between a user and system controller 460 may be implemented, for example, via a cathode ray tube (CRT) monitor or monitors with commands or instructions implemented by an interface means such as a keyboard, mouse, light-pen sensor or touch screen monitor.

Figure 12:
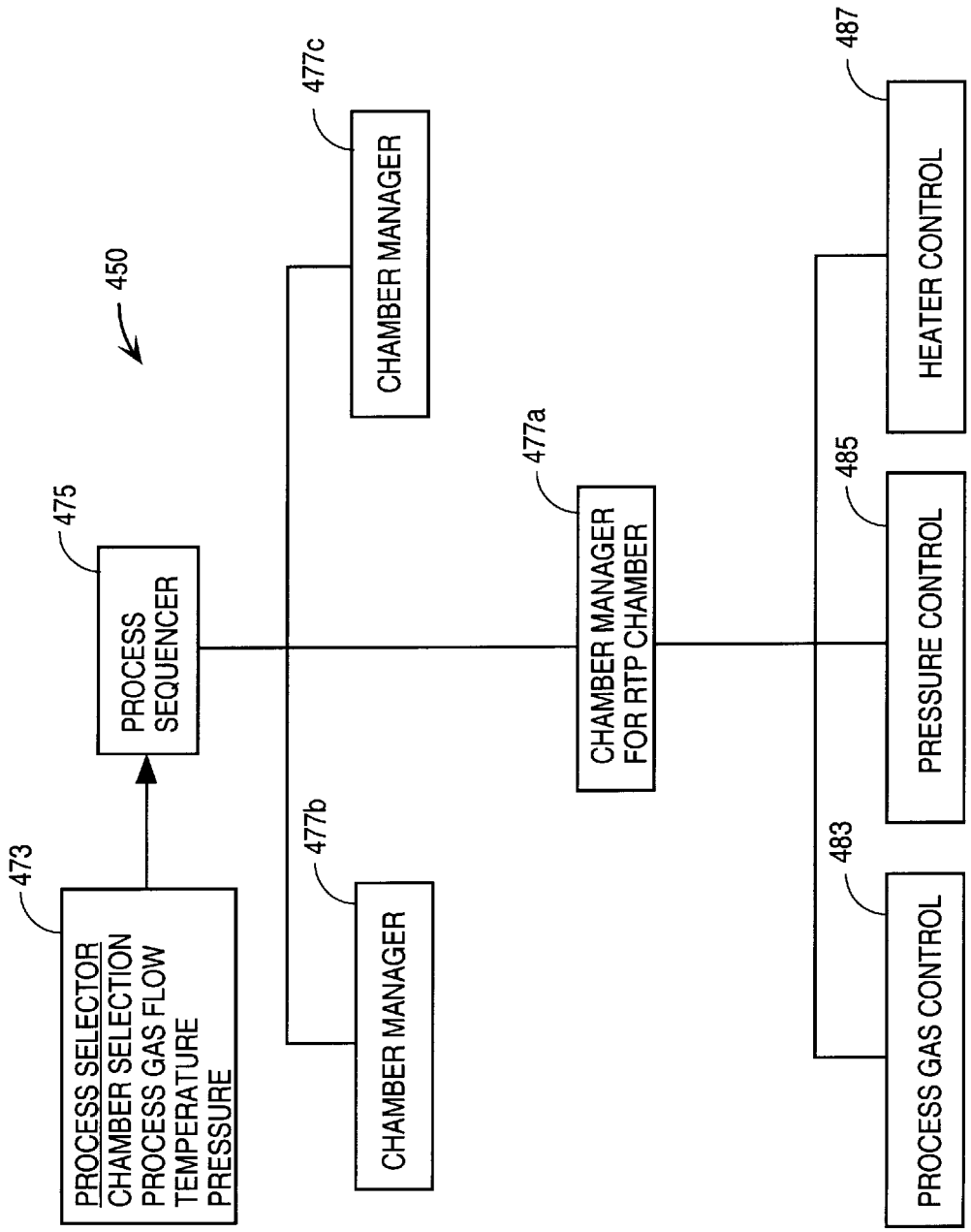
FIG. 12 is an illustrative block diagram of the hierarchical control structure of the control signal generation logic to operate the process system according to one embodiment of the invention.

FIG. 12 shows an illustrative block diagram of the hierarchical control structure of control signal generation logic 450, according to one embodiment of the invention. In a multi-process chamber environment, for example, a user enters a process set number and process chamber number into a process selector subroutine 473 in response to menus or screens displayed on the CRT monitor. The process sets are predetermined sets of process parameters necessary to carry out specified processes, and are identified by predefined set numbers. Process selector subroutine 473 identifies (i) the desired process chamber, and (ii) the desired set of process parameters needed to operate the process chamber for performing the desired process. The process parameters for performing a specific process relate to process conditions such as, for example, process gas composition and flow rates, temperature, reaction pressure, cooling gas pressure, and chamber wall temperature and are provided to the user in the form of a recipe. The parameters specified by the process recipe are entered utilizing the CRT monitor interface. The signals for monitoring the process are provided by the analog input and digital input board of system controller 460 and the signals for controlling the process are output on the analog output and digital output board of system controller 460.

Process sequencer subroutine 475 includes program codes for accepting the identified process chamber and set of process parameters from process selector subroutine 473 and for controlling the operation of various process chambers. Multiple users can enter process set numbers and process chamber numbers, or a user can enter multiple process set numbers and process chamber numbers, so process sequencer subroutine 475 operates to schedule the selected processes in the desired sequence. Process sequencer subroutine 475 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, process sequencer subroutine 475 can be designed to take into consideration the condition of the process chamber being used in comparison with the desired process conditions for a selected process, or the "age" of each particular user-entered request, or any other relevant factor a system programmer desires to include for determining scheduling priorities.

Once process sequencer subroutine 475 determines which process chamber and process set combination is going to be executed next, process sequencer subroutine 475 causes the execution of the process set by passing the particular process set parameters to chamber manager subroutine 477*a*–*c* that controls multiple processing tasks in a process chamber according to the process set determined by process sequencer subroutine 475. For example, chamber manager subroutine 477*a* includes program code for controlling the ratios of reaction gases and gas flow rates in process chamber 213. Chamber manager subroutine 477*a* also controls execution of various chamber component subroutines that control the operation of chamber components necessary to carry out the selected process set. Examples of chamber component subroutines are process gas control subroutine 483, pressure control subroutine 485, and heater control subroutine 487. It is to be appreciated that other chamber control subroutines may be included depending on the process demand.

In operation, chamber manager subroutine 477*a* selectively schedules or calls the process component subroutine in accordance with the particular process set being executed. Chamber manager subroutine 477*a* schedules the process component subroutine similarly to how the process sequencer subroutine 475 schedules which process chamber and process set is to be executed next. Typically, chamber manager subroutine 477*a* includes steps of monitoring the various chamber components, determining which component needs to be operated based on the process parameters for the process set to be executed and causing execution of a chamber component subroutine responsive to the monitoring and determining steps.

Process gas control subroutine 483 has program code for controlling process gas composition and flow rates. Process gas control subroutine 483 controls the open/close position of the safety shut-off valves, and also ramps up/down the flow controllers to obtain the desired gas flow rate. Process gas control subroutine 483 is invoked by chamber manager subroutine 477*a*, as are all chamber component subroutines, and receives from chamber manager subroutine 477*a* process parameters related to the desired gas flow rate. Typically, process gas control subroutine 483 operates by opening the gas supply lines to set the appropriate gas mixture of oxygen-containing gas 410 and hydrogen-containing gas 415, and repeatedly (i) reading the necessary flow controller, (ii) comparing the reading to the desired flow rate received from chamber manager subroutine 477*a*, and (iii) adjusting the flow rate of a gas supply line as necessary. Further, process gas control subroutine 483 includes the steps of monitoring the gas flow rates for unsafe rates and activating the safety shut-off valve when an unsafe condition is detected.

Prior art processing systems included an interlock system in conjunction with gas inlet 269 to prevent oxygen-containing gas and hydrogen-containing gas from combining in manifold 435 for fear of potentially dangerous consequences resulting from the mixture of these two gases. The invention contemplates that oxygen-containing gas 410 and hydrogen-containing gas 415 are to be mixed in desired amounts in manifold 435 and supplied together to gas inlet 269 of RTP apparatus 200.

Pressure control subroutine 485 includes program code for controlling the pressure in chamber 213 by regulating the size of the opening of the throttle valve in the exhaust system of chamber 213. The size of the opening of the throttle valve is set to control the chamber pressure to the desired level in relation to the total process gas flow, size of the process chamber, and pumping setpoint pressure for the exhaust system. When pressure control subroutine 485 is invoked, the desired or target pressure level is received as the parameter from chamber manager subroutine 477*a*. Pressure control subroutine 485 operates to measure the pressure in chamber 213 by reading one or more pressure nanometers connected to the chamber, compare the measured value(s) to the target pressure, obtain PID (proportional, integral, and differential) values from a stored pressure table corresponding to the target pressure, and adjust the throttle valve according to the PID values obtained from the pressure table. Alternatively, pressure control subroutine 485 can be written to open or close the throttle valve to a particular opening size to regulate chamber 213 to the desired pressure.

Heater control subroutine 487 includes program code for controlling the current to light pipe assembly 218 that is used to heat substrate 100 and chamber 213. Heater control subroutine 487 is also invoked by chamber manager subroutine 477a and receives a target or setpoint temperature parameter. Heater control subroutine 487 measures the temperature by temperature signals delivered from fiber optic probes 270, compares the measured temperature to the setpoint temperature and increases or decreases current applied to light pipe assembly 218 to obtain the set point temperature. The temperature is obtained from the measured voltage by looking upon the corresponding temperature in a stored conversion table or by calculating the temperature using a fourth order polynomial.

The process for controlling the flow of process gases to chamber 213 can be implemented using a computer program product that is executed by system controller 460. The computer program code can be written in a computer readable programming language, such as for example, 68000 assembly language C, C++, Pascal, Fortran, or others. Suitable program code is generally entered into a single file, or multiple files, using a text editor, and stored or embodied in a computer usable medium, such as the memory system of a computer. If the entered code text is in a high level language, the code is compiled, and the resultant compiler code is then linked with an object code of precompiled object code, the system invokes the object code, causing the computer system to load the code in memory, from which the central processing unit (CPU) reads and executes the code to perform the task identified in the program.

The above embodiments relate to reoxidation processes utilizing dry $O_2$ and in situ generated steam. A comparison of the dry $O_2$ process of FIG. 8a and the in situ steam generation reoxidation process of FIG. 8b reveals that both processes are effective in displacing nitrogen-containing material from a substrate interface, but the in situ steam generation reoxidation process is more effective in terms of producing more oxide per unit time at similar temperatures. Thus, the in situ steam generation process allows a more effective utilization of the thermal budget of an oxidation than the dry $O_2$ process.

The invention also relates to a dry oxygen-containing gas reoxidation process, wherein the oxygen-containing gas is nitrous oxide ($N_2O$). Thus, in the processing system described in FIG. 11 and the accompanying text, control signal generation logic 450 would direct system controller 460 to carry out the reoxidation process of the invention only in the presence of oxygen-containing gas 410, where oxygen-containing gas 410 is $N_2O$, or the in the presence of $N_2O$ and another inert gas. Accordingly, system controller 460 would actuate mass flow controller 430 associated with hydrogen-containing gas 415 to close the valve associated with mass flow controller 430.

Figure 13:
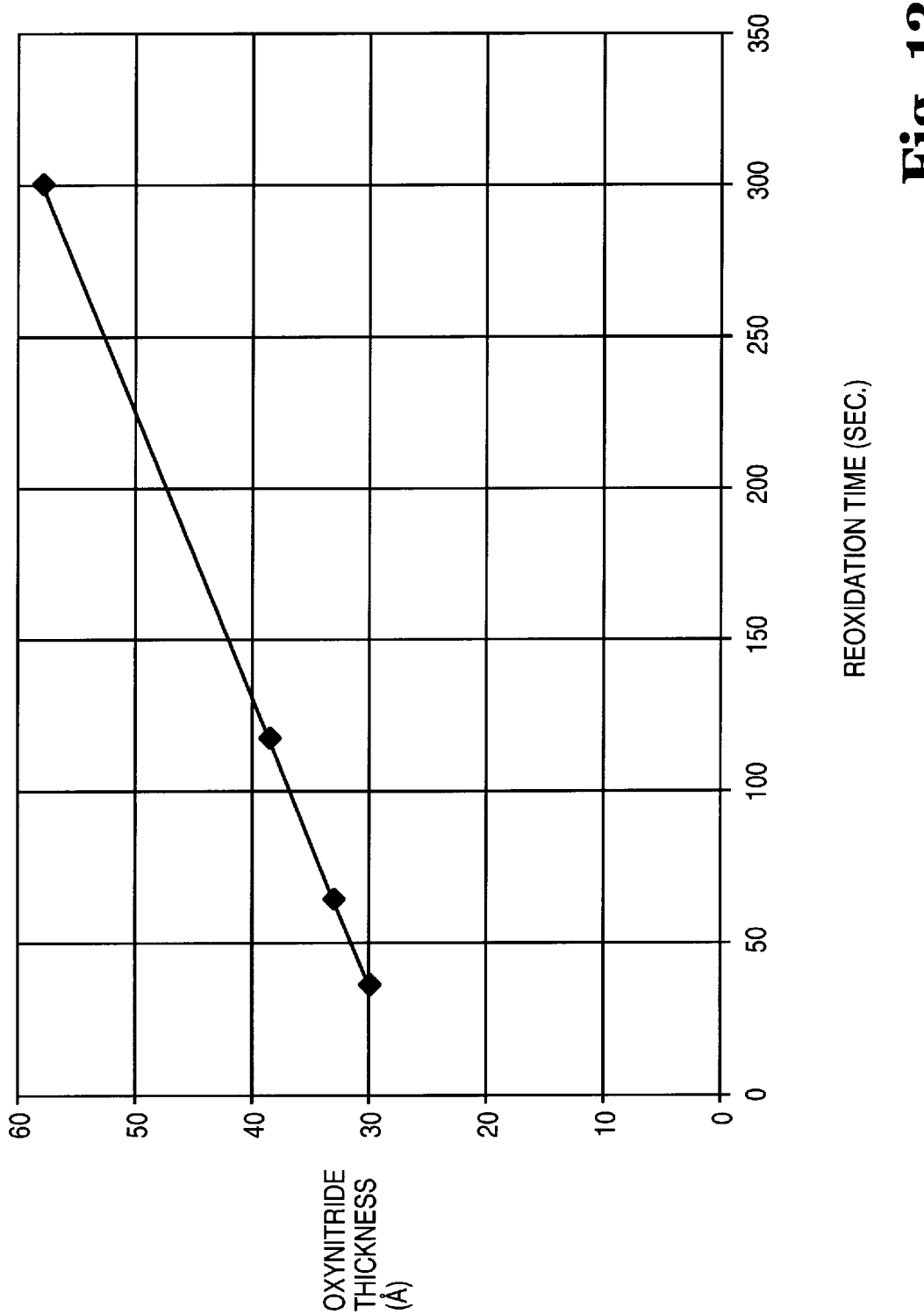
FIG. 13 is a graphical representation of the reoxidation rate in an oxygen-containing gas of $N_2O$ of a silicon substrate having a $Si_xN_yO_z$ film.

$N_2O$ forms an acceptable oxide through a thermally efficient reoxidation similar to the in situ steam generation process described above. FIG. 13 illustrates the reoxidation of a silicon substrate or wafer containing a $Si_xN_yO_z$ film carried out in an RTP apparatus such as described above. The $Si_xN_yO_z$ film is created by a 30 second oxidation at 800° C. to yield a film thickness of approximately 16 Å. Next, a reoxidation is carried out in an oxygen-containing gas for 60 seconds at 1050° C. The reoxidation yields a final dielectric layer thickness (oxide plus $Si_xN_yO_z$) of approximately 34 Å. The dielectric layer thickness is approximately 39 Å after 120 seconds.

The above example demonstrates that reoxidation in an oxygen-containing gas of $N_2O$ is significantly better than the 25 Å and 29 Å final dielectric layer thickness seen in a reoxidation in dry $O_2$ under similar conditions (1050° C. for similar time periods—60 seconds and 120 seconds, respectively). In other words, more oxide is produced per unit time at a given temperature under $N_2O$ gas atmosphere than a dry $O_2$ atmosphere. Thus, a reoxidation of a nitrogen-containing material including, but not limited to, $Si_3N_4$ and $S_xN_yO_z$ in $N_2$ gas is a thermally effective method of producing an oxide.

Figure 14:
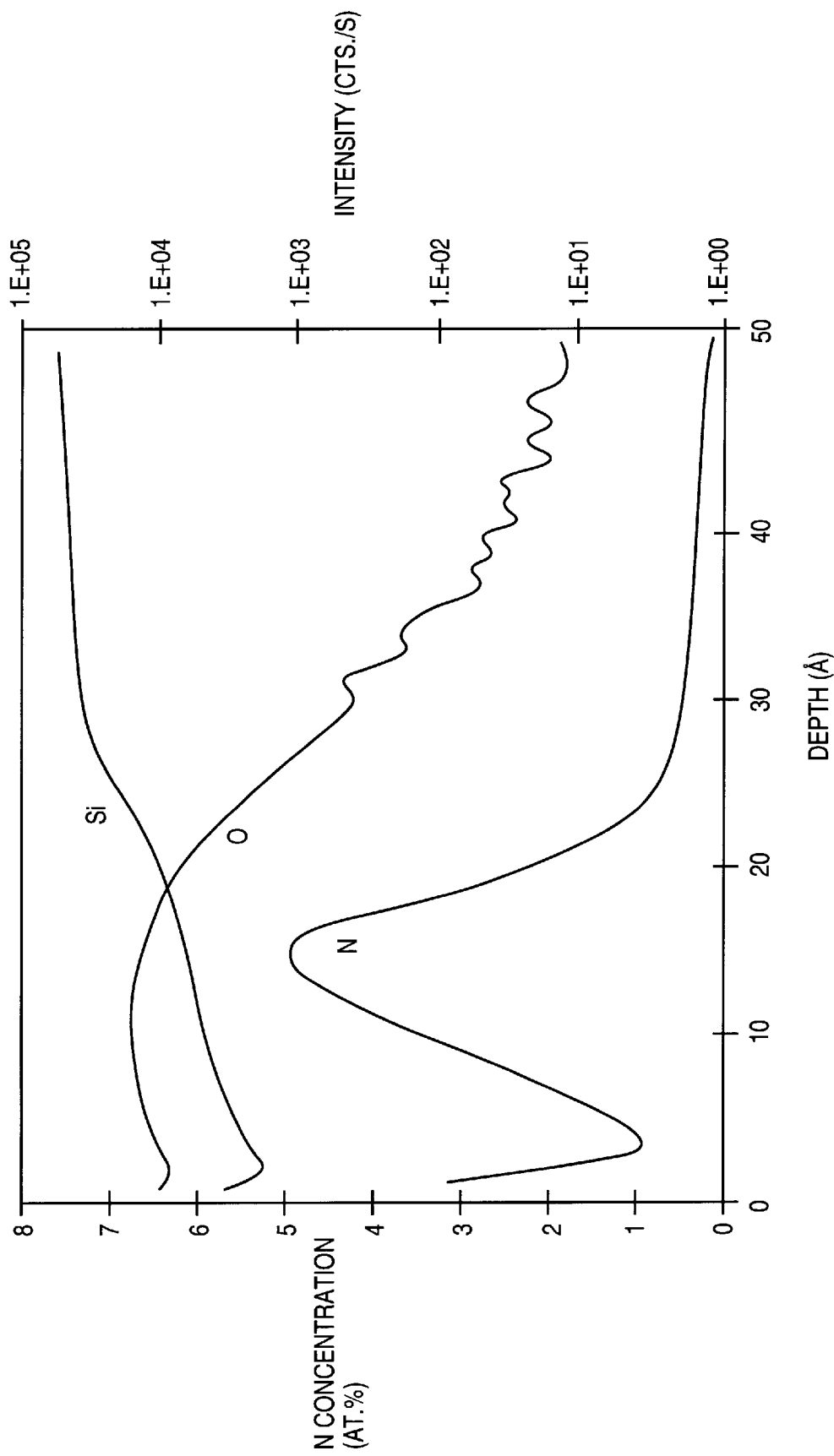
FIG. 14 is a SIMS profile of a silicon substrate containing a dielectric layer formed by the reoxidation of $Si_xN_yO_z$ film in an oxygen-containing gas of $N_2O$ process after 60 seconds.
Figure 15:
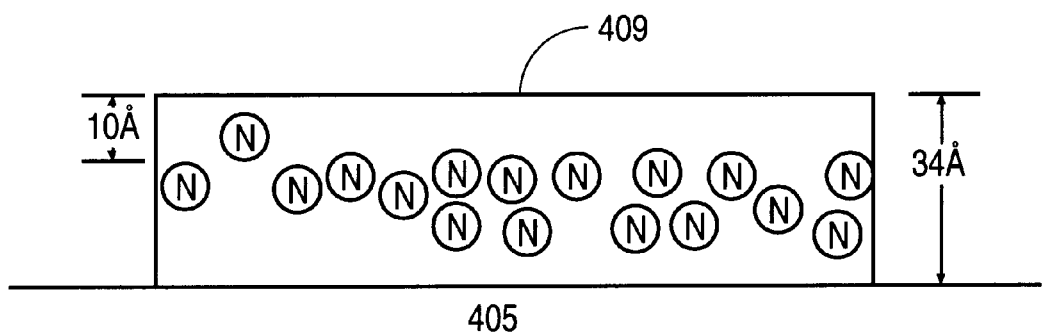
FIG. 15 is a schematic illustration of a dielectric layer overlying a silicon substrate, the dielectric layer formed by the reoxidation of a $Si_xN_yO_z$ film in an oxygen-containing gas of $N_2O$.

FIG. 14 shows a SIMS profile of a silicon substrate or wafer containing a dielectric layer formed by reoxidation in $N_2O$ gas of a $Si_xN_yO_z$ film under the reaction conditions described in FIG. 13. FIG. 14 shows that reoxidation in $N_2O$ gas is effective at displacing nitrogen-containing material from the dielectric layer/Si interface. Similar to the in situ steam generation process described above, FIG. 14 also shows the nitrogen-containing material does not dominate the surface of the dielectric layer. Instead, the largest concentration of nitrogen-containing material is at a depth of approximately 15 Å. FIG. 15 shows a schematic side view of dielectric layer 409 formed over silicon substrate or wafer 405 utilizing a reoxidation in $N_2O$ of a $Si_xN_yO_z$ under the reaction conditions described above with reference to FIG. 13 and the accompanying text.

The above invention has been described with reference to a reoxidation of a silicon substrate or wafer. As noted, however, the techniques described are not to be limited to reoxidation of a silicon substrate or wafer. Instead, the techniques may be used whenever reoxidation processes are practiced with a view toward efficiently managing a thermal budget. It is to be appreciated, for example, that the in situ steam generation reoxidation process or the $N_2O$ process of the invention can be used to oxidize any form of silicon including epitaxial, amorphous, or polycrystalline, including doped and undoped forms.

Novel methods for reoxidation of a substrate having a nitrogen-containing material or nitride film on a surface have been described.

What is claimed is:

1. A method of forming an oxide in the presence of a nitrogen-containing material, comprising:

placing a substrate in a chamber, the substrate having a nitrogen-containing material on a surface;

introducing an oxygen-containing gas into the chamber;

introducing a hydrogen-containing gas into the chamber at a first location; and heating the substrate to a temperature sufficient to initiate a reaction between the oxygen-containing gas and the hydrogen-containing gas in the chamber at a location adjacent the surface of the substrate and separate from the first location.

2. The method of claim 1, wherein heating the substrate includes heating the substrate to a temperature of 1050° C.

3. The method of claim 1, wherein providing a hydrogen-containing gas includes providing an amount up to 50 percent of the total gas concentration.

4. The method of claim 3, wherein the hydrogen-containing gas is hydrogen ($H_2$).

5. The method of claim 1, wherein the oxygen-containing gas is oxygen ($O_2$).

6. The method of claim 1, wherein the nitrogen-containing material is one of a silicon nitride and a silicon oxynitride.

7. The method of claim 1, wherein the reaction conditions in the chamber are such that the amount of a nitrogen at an interface between the oxide and the substrate is 0.5 percent or less.

8. A method of oxidizing a substrate comprising:

placing a substrate in a chamber, the substrate having a nitride film on a surface;

introducing an oxygen-containing gas into the chamber;

introducing a hydrogen-containing gas into the chamber under conditions such that the hydrogen-containing gas enters the chamber without reacting with the oxygen-containing gas; and heating the substrate to a temperature sufficient to initiate a reaction between the oxygen-containing gas and the hydrogen-containing gas adjacent the substrate under conditions to dispose an oxide between the nitride film and the substrate.

9. The method of claim 8, wherein heating the substrate includes heating the substrate to a temperature of 1050° C.

10. The method of claim 8, wherein providing a hydrogen-containing gas includes providing an amount up to 50 percent of the total gas concentration.

11. The method of claim 10, wherein the hydrogen-containing gas is hydrogen ($H_2$).

12. The method of claim 8, wherein the oxygen-containing gas is oxygen ($O_2$).

13. The method of claim 8, wherein the nitride film is one of a silicon nitride film and a silicon oxynitride film.

14. The method of claim 8, wherein the reaction is such that the amount of a nitrogen at an interface between the oxide and the substrate is 0.5 percent or less.

15. A method of forming an oxide in the presence of a nitrogen-containing material, comprising:

placing a substrate in a chamber, the substrate having a nitrogen-containing material on a surface; and reacting a portion of an oxygen-containing gas and a portion of a hydrogen-containing gas introduced in the chamber adjacent the surface of the substrate under conditions to dispose an oxide between the nitrogen-containing material and the substrate.

16. The method of claim 15, further comprising:

heating the substrate to a temperature sufficient to initiate the reaction between the oxygen-containing gas and the hydrogen-containing gas.

17. The method of claim 15, wherein heating the substrate includes heating the substrate to a temperature of 1050° C.

18. The method of claim 15, wherein the hydrogen-containing gas comprises an amount up to 50 percent of the total gas concentration.

19. The method of claim 15, wherein the reaction is such that the amount of a nitrogen at the surface of the substrate following the disposition of the oxide is 0.5 percent or less.

20. A method of growing an oxide layer in the presence of a nitrogen-containing material, comprising:

placing a silicon wafer having a nitrogen-containing material on a surface of the wafer in a rapid thermal processor;

providing an oxygen-containing gas into the rapid thermal processor;

providing a hydrogen-containing gas into the rapid thermal processor at a first location; and heating the wafer to a temperature sufficient to initiate a reaction adjacent the wafer and separate from the first location between a portion of the oxygen-containing gas and a portion of the hydrogen-containing gas in the rapid thermal processor to dispose an oxide between the nitrogen-containing material and the wafer.

21. The method of claim 20, wherein heating the substrate includes heating the wafer to a temperature of 1050° C.

22. The method of claim 20, wherein providing a hydrogen-containing gas includes providing an amount up to 50 percent of the total gas concentration.

23. The method of claim 20, wherein the reaction is such that the amount of a nitrogen at an interface between the oxide and the wafer is 0.5 percent or less.

24. The method of claim 23, wherein the combined partial pressure of the oxygen-containing gas and the hydrogen-containing gas is less than atmospheric pressure prior to reacting the oxygen-containing gas.

* * * * *